(12) United States Patent
Hebert

(10) Patent No.: US 6,768,173 B2
(45) Date of Patent: Jul. 27, 2004

(54) HIGH VOLTAGE MOS TRANSISTOR WITH UP-RETRO WELL

(75) Inventor: Francois Hebert, San Mateo, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 10/345,467

(22) Filed: Jan. 14, 2003

(65) Prior Publication Data

US 2003/0127689 A1 Jul. 10, 2003

Related U.S. Application Data

(62) Division of application No. 09/564,597, filed on May 3, 2000, now Pat. No. 6,528,850.

(51) Int. Cl.[7] .............................................. H01L 31/113
(52) U.S. Cl. ....................... 257/345; 257/331; 257/335; 438/358
(58) Field of Search ................................. 257/335–337, 257/344–346, 372, 373, 375, 376, 408; 438/300, 305, 306, 358, 368, 369

(56) References Cited

U.S. PATENT DOCUMENTS

| 4,963,973 A | | 10/1990 | Watanabe et al. ............ 257/370 |
| 5,132,235 A | * | 7/1992 | Williams et al. ............. 438/294 |

OTHER PUBLICATIONS

Acc. No. NB920627, IBM Technical Disclosure Bulletin vol. 35 No. 1B pp 27–28, (Jun. 1992).
Claudio Contiero et al., "Characteristics and Applications of a 0.6 μm Bipolar–CMOS–DMOS Technology combining VLSI Non–Volatile Memories," *IEDM*, pp. 465–468 (1996).

Yusuke Kawaguchi et al., "A low on–resistance 60 V MOS-FET high side switch an a 30 V npn transistor based on 5 V BiCMOS process," *BCTM*, pp. 151–154 (1997).
Yong Qiang Li et al., "Integration of High Voltage NMOS Devices into a Submicron BiCMOS Process Using Simple Structural Changes," *IEDM*, pp. 403–406 (1994).
Zahir Parpia et al., "A CMOS–Compatible High–Voltage IC Process," *TED*, 35(10):1687–1694.
Chin–Yu Tsai et al., "16–60V Rated LDMOS Show Advanced Performance in an 0.72 μm Evolution BiCMOS Power Technology," *IEDM*, pp. 367–370 (1997).
Paul G. Y. Tsui, "Integration of Power LDMOS into a Low–Voltage 0.5 μm BiCMOS Technology," *IEDM*, pp. 27–30 (1992).
Silicon Processing for the Vlsi Era, vol. II, pp. 384–385 and pp. 389–392.

* cited by examiner

*Primary Examiner*—Minhloan Tran
*Assistant Examiner*—Thomas L Dickey
(74) *Attorney, Agent, or Firm*—Fish & Neave; Robert W. Morris; Jeffrey D. Mullen

(57) ABSTRACT

A high voltage MOS transistor is provided that is compatible with low-voltage, sub-micron CMOS and BiCMOS processes. The high voltage transistor of the present invention has dopants that are implanted into the substrate prior to formation of the epitaxial layer. The implanted dopants diffuse into the epitaxial layer from the substrate during the formation of the epitaxial layer and subsequent heating steps. The implanted dopants increase the doping concentration in a lower portion of the epitaxial layer. The implanted dopants may diffuse father into the epitaxial layer than dopants in the buried layer forming an up-retro well that prevents vertical punch-through at high operating voltages for thin epitaxial layers. In addition, the doping concentration below the gate may be light so that the threshold voltage of the transistor is low. Also, the high voltage transistor of the present invention may be isolated from the substrate and the buried layer, and have symmetrical source and drain regions so that it can be used as a pass transistor.

56 Claims, 12 Drawing Sheets

HIGH VOLTAGE MOS TRANSISTOR WITH UP-RETRO WELL

CROSS REFERENCE TO RELATED APPLICATION

This application is a divisional of U.S. patent application Ser. No. 09/564,597 filed May 3, 2000 now U.S. Pat. No. 6,528,850, which is hereby incorporated by reference herein in its entirety.

BACKGROUND OF THE INVENTION

This invention relates to high voltage MOS transistors. More particularly, this invention relates to apparatus and methods for forming an MOS transistor with a substrate implant to achieve various combinations of low threshold voltage, high breakdown voltage, and transistor operation at high voltages without experiencing vertical punch-through.

Many applications for semiconductor devices require transistors that are isolated from the substrate and that can operate at high voltages (e.g., greater than 40 volts). Applying a high voltage to a transistor can cause several problems. For example, a high voltage at the drain can cause vertical punch-through in an NMOS transistor with an P-type substrate and in a PMOS transistor with an N-type substrate. Vertical punch-through can cause unwanted current flow between the drain and the buried layer at high drain voltages.

One previously known high voltage DMOS transistor 10 is shown in FIG. 1A. DMOS transistor 10 has a grounded body and a high threshold voltage. DMOS transistor 10 includes highly doped N-type (i.e., N+) source region 12, N+ drain region 14, P-type body region 16, gate 15, N-type drain region 13 of an N-type epitaxial layer, and P-type substrate 17. N-type drain region 13 is tied electrically to N+ drain region 14 (because both regions are N-type) to form an extension of the drain. Thick oxide layer 18 lies between gate 15 and N-type drain region 13. This configuration reduces the impact generation rate of carriers by reducing the electric field in the drain at high drain voltages. However, thick oxide layer 18 causes DMOS transistor 10 to have undesirably large device dimensions. Thick oxide layer 18 also increases the drain-to-source resistance ($R_{DS-ON}$) which is also undesirable, because thick oxide 18 encroaches down into N-type drain region 13. A further disadvantage of transistor 10 is that the N-type doping concentration in N-type drain region 13 is higher near bird's beak 18A of thick oxide 18 than the N-type doping concentration near the lower boundary 18B of thick oxide 18. This effect causes an increased electric field under the gate which is also undesirable.

A further disadvantage of DMOS transistor 10 is that it cannot be used as a pass transistor, particularly a high voltage pass transistor. A pass transistor is a device in which the source and the drain regions are interchangeable and preferably symmetrical. In a pass transistor, the source, drain, and body regions must be isolated from the substrate. Furthermore, in a high voltage pass transistor, the body region cannot be tied electrically to either the source or the drain. Transistor 10 does not meet these criteria, because its source (region 12) and drain (region 14 and a portion of layer 13) are not symmetrical, body region 16 is tied electrically to the source, and body region 16 is tied electrically to substrate 17. Further features of the DMOS transistor with grounded body are described in an article by Parpia et al., entitled "A CMOS Compatible High-Voltage IC Process," IEEE Transactions on Electron Devices, Vol. 35, No. 10, October 1988, pp. 1687–1694.

Another previously known high voltage DMOS transistor 20 with an isolated body is shown in FIG. 1B. DMOS transistor 20 includes highly doped N-type (i.e., N+) source region 22, N+ drain region 27, P-type body region 24, gate 21, thick oxide 25, P-type epitaxial layer 26, P-type substrate 29, N-type well 23 in P-epitaxial layer 26, and highly doped N+ buried layer 28. N+ buried layer 28 isolates substrate 29 from body region 24 to prevent current flow between these two regions. However, N+ buried layer 28 is tied electrically to drain region 27 through N-well 23. Therefore, the output capacitance at the drain is undesirably high because N+ buried layer 28 has a wide area. High output capacitance is undesirable because it slows down the frequency of the transistor's output signal. Furthermore, DMOS transistor 20 cannot be used as a pass transistor, because the source (region 22) and the drain (including regions 27 and 23) are not symmetrical, and body region 24 is tied electrically to the source at P+ region 19. Further features of the DMOS transistor with isolated body are described in an article by Tsui et al., entitled "Integration of Power LDMOS into a Low-Voltage 0.5 $\mu$m BiCMOS Technology," IEDM Digest, 1992, pp. 27–30.

Yet another previously known high voltage MOS transistor 30 is shown FIG. 1C. Transistor 30 has high voltage P-type well 35 that forms the body region of the device in N-type epitaxial layer 42. N-type extension regions 36 and 38 in P-well 35 form extensions of the drain and source regions. Transistor 30 also has highly doped N-type regions 32 and 34. Regions 32/36 and regions 34/38 are symmetrical and may be used interchangeably as drain and source regions of transistor 30. Transistor 30 also has N+ buried layer 40 that is not tied electrically to the drain as shown in FIG. 1C. In transistor 30, vertical punch-through between the drain and buried layer 40 can occur when the depletion regions of the drain and N-epitaxial layer 42 merge in P-well 35 at high drain voltages. For example, if regions 32 and 36 form the drain, then vertical punch-through can occur when the depletion region of the N-extension 36 PN junction in P-well 35 meets the depletion region of the N-epitaxial layer 42 PN junction in P-well 35. The output capacitance of transistor 30 is high during vertical-punch-through because the drain and buried layer 40 become electrically coupled together.

To prevent vertical punch-through in transistor 30, two parameters may be changed. First, the doping concentration of P-well body 35 may be increased (e.g., $4-5 \times 10^{12}$ cm$^{-2}$) to reduce expansion of the drain and buried layer depletion regions at high voltages. High doping in body region 35 causes the undesirable effects of increasing the threshold voltage of the transistor and reducing the breakdown voltage at the drain-to-body junction. Secondly, the depth of body region 35 and the thickness of epitaxial layer 42 may be increased so that the depletion regions do not merge at high voltages.

Because the drain and epitaxial layer depletion regions at 40 volts are each about 3.3 microns (micrometers) thick for MOSFETs, the thickness of the epitaxial layer must be greater than 6 microns. A vertical NPN bipolar junction transistor (BJT) with a breakdown voltage of 40 volts requires only about 4 microns of epitaxial thickness. In BiCMOS processes a uniform epitaxial layer is used for MOSFETs and BJTs (bipolar junction transistors). Because the MOSFETs must have an epitaxial thickness of at least 6 microns to operate properly, the thickness of all of the devices formed in the same wafer including the BJTs must be at least 6 microns to achieve isolation. A thicker epitaxial layer undesirably reduces $f_T$ (the frequency at which the current gain goes to unity), causes a higher $V_{CE-SAT}$ (collector-emitter saturation voltage), and causes a higher collector resistance for the BJTs.

A further technique for reducing the threshold voltage in high voltage transistors involves using retrograde wells. A retrograde well is a region of doped silicon that has a doping concentration which decreases toward the surface of the well. The retrograde well may be used for the body of the transistor to achieve a reduced threshold voltage. FIG. 2A is a graph of the doping concentration along a vertical cross section below the gate oxide of an NMOS device with a retrograde P-type well formed in an N-type epitaxial layer on a P-type substrate with a highly doped N-type buried layer. In FIG. 2A, solid lines 44 represent the concentration of P-type dopants, and dotted line 46 represents the concentration of N-type dopants. FIG. 2B is a graph of the doping concentration along a vertical cross section below the gate oxide of an NMOS device with a retrograde P-type well formed in a P-type epitaxial layer on a P-type substrate with a highly doped N-type buried layer. In FIG. 2B, solid line 47 represents the concentration of P-type dopants and dotted line 48 represents the concentration of N-type dopants.

A retrograde P-well may be formed using Boron diffusion followed by surface oxidation in order to reduce the Boron doping concentration at the surface of the well. However, the reduction in the P-type doping concentration at the surface of the retrograde well is typically not adequate to achieve the desired reduction in surface concentration to achieve a sufficient reduction in the threshold voltage and protection against vertical punch-through. For example, a reduction of 4–8 times in the P-type doping concentration at the surface of the retrograde well is typically required.

Retrograde wells may also be achieved using high-energy, deep ion implantation. However, for high voltage (>20 V) applications, the peak doping concentration of the retrograde well must be high enough to prevent vertical punch-through. In addition, the highly concentrated dopants must be deep enough in the epitaxial layer so that the breakdown voltage of the transistor is not reduced. More than 400 KeV of implantation energy is required to implant the peak doping concentration deep enough into the epitaxial layer so that breakdown voltage criteria are achieved while taking into account diffusion of the implanted dopants. High energy implanters are therefore required for this process. These tools are not commonly available and are extremely expensive.

It would, however, be desirable to provide a transistor that has a thin epitaxial layer and that can operate a high voltage without experiencing vertical punch-through or breakdown. It would further be desirable to provide a high voltage MOS transistor having a low threshold voltage. It would also be desirable to provide a high voltage MOS transistor that can be fabricated with low-voltage CMOS and BiCMOS processes. It would also be desirable to provide a high-voltage MOS transistor that has a symmetrical structure and that is fully isolated from the substrate so that it can operate effectively as a pass transistor.

SUMMARY OF THE INVENTION

It is an object of the present to provide an MOS transistor that has a thin epitaxial layer and can operate at high voltages without experiencing vertical punch-through or breakdown.

It is also an object of the present invention to provide an MOS transistor with a low threshold voltage.

It is a further object of the present invention to provide a high voltage MOS transistor that is compatible with low-voltage sub-micron CMOS and BiCMOS processes.

It is a further object of the present invention to provide a high voltage MOS transistor that has a symmetrical structure and that is fully isolated from the substrate so that it can operate as a pass transistor.

These and other objects of the present invention are provided by high-voltage MOS transistors having substrate implants. In a preferred embodiment, the MOS transistor has an up-retro well extending from a buried layer in the substrate into the epitaxial region of the transistor. The present invention also includes methods for forming MOS transistors with a substrate implant. In a preferred embodiment of the present invention, dopants are implanted and driven into the substrate of a semiconductor wafer to form a highly doped buried layer. Additional dopants are then implanted into the substrate to form an up-retro well. An epitaxial layer is then formed on the substrate. The up-retro well dopants diffuse up from the substrate into the epitaxial layer to form an up-retro well region. The up-retro well dopants have a high diffusivity so that they diffuse up into the epitaxial layer beyond the buried layer.

The up-retro well prevents vertical punch-through and breakdown, and allows for a low threshold voltage in high voltage MOS transistors. High voltage MOS transistors with an up-retro well may be formed in a semiconductor wafer that has a thin epitaxial layer. Also, high voltage MOS transistors of the present invention can be used as pass transistors because the source and drain regions may be used interchangeably. High-voltage MOS transistors of the present invention may be fabricated using processes that are standard in low voltage sub-micron CMOS and BiCMOS process technology.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

PREFERRED EMBODIMENT OF THE INVENTION

Process steps for an illustrative embodiment of a high voltage MOS transistor with an up-retro well are shown in FIGS. 3A–3F. In this embodiment, an NMOS transistor is formed in a P-type epitaxial layer on a P-type substrate. A highly doped N+ buried layer is formed in the P-substrate to isolate the P-epitaxial layer and the P-substrate. The NMOS transistor has a P-type up-retro well that is formed from dopants implanted into the substrate. The up-retro well P-type dopants diffuse into the P-epitaxial layer (farther than the N-type buried layer dopants) when the epitaxial layer is formed and during subsequent heating steps. The P-type up-retro well dopants increase the net concentration of P-type dopants in the region of the P-epitaxial layer into which the up-retro well dopants diffuse. The region of increased net P-type doping concentration is above the epitaxy-substrate interface. The up-retro well dopants allow the epitaxial layer to be made relatively thin. The increased net concentration of P-type dopants in the up-retro well region of the epitaxial layer prevents vertical punch-through at high operating voltages despite the thin epitaxial layer by reducing the expansion of the drain and buried layer depletion regions in the epitaxial layer.

In the NMOS transistor formed by the process steps of FIGS. 3A–3F, a low concentration of P-type dopants may be achieved in the body region of the transistor below the gate to allow the transistor to turn on at a low threshold voltage. Also, the NMOS transistor of FIGS. 3A–3F may be used as a pass transistor because its drain and source regions are symmetrical and interchangeable; the drain, source, and body regions are isolated from the substrate; and the body is not tied electrically to the source or drain. The isolation of the drain, source, and body regions also provides low output capacitance. The high-voltage MOS transistor of FIGS. 3A–3F may be fabricated using processes that are standard in low voltage sub-micron CMOS and BiCMOS process technology.

Figure 1A:
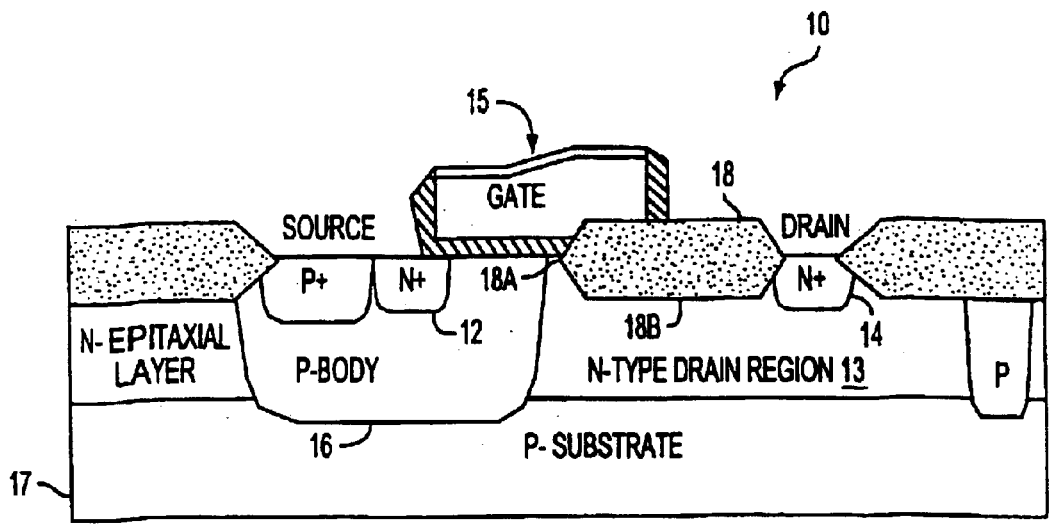
FIG. 1A is a cross-sectional diagram of a prior art DMOS transistor with a grounded body.
Figure 1B:
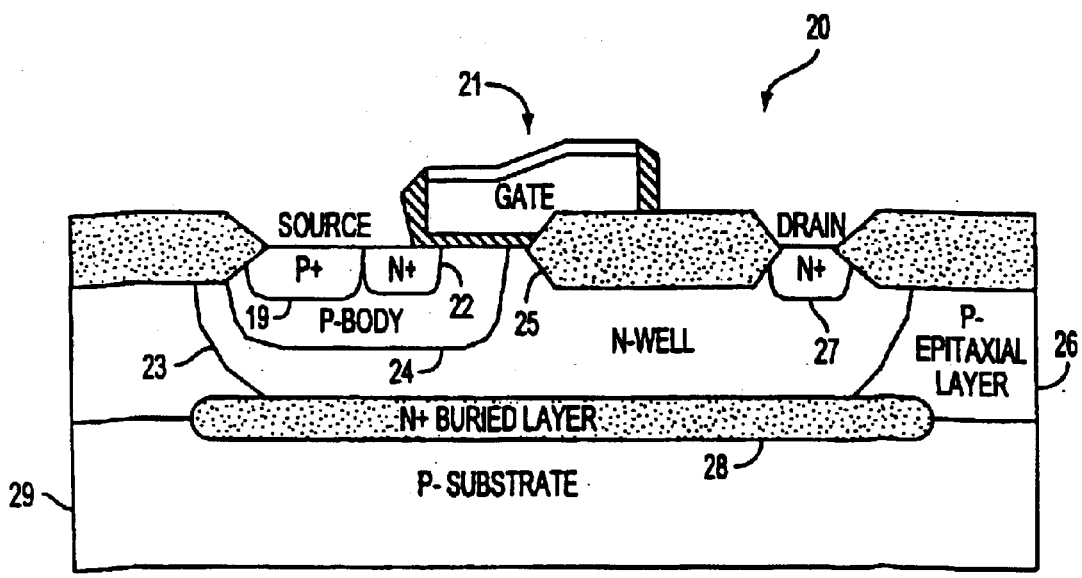
FIG. 1B is a cross-sectional diagram of a prior art DMOS transistor with an isolated body.
Figure 1C:
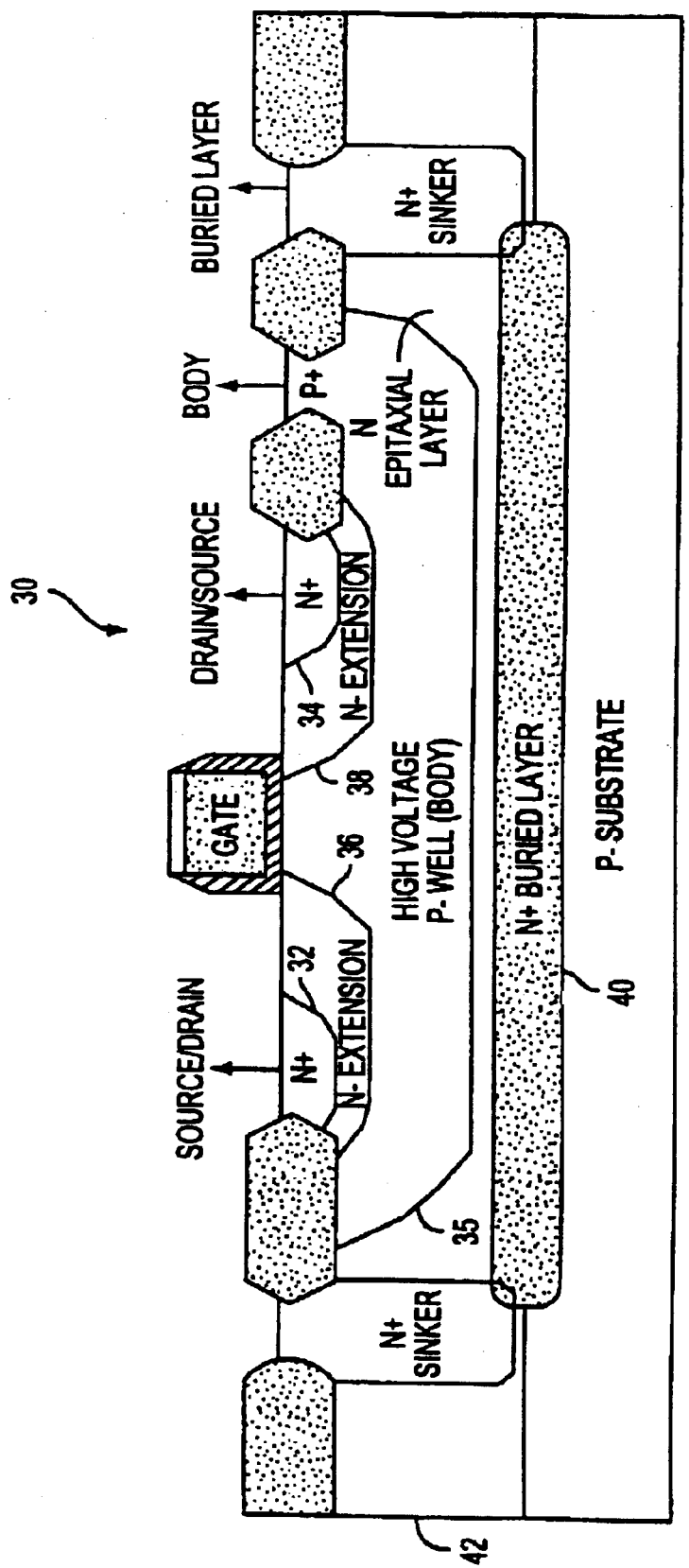
FIG. 1C is a cross-sectional diagram of a prior art MOS transistor.
Figure 2A:
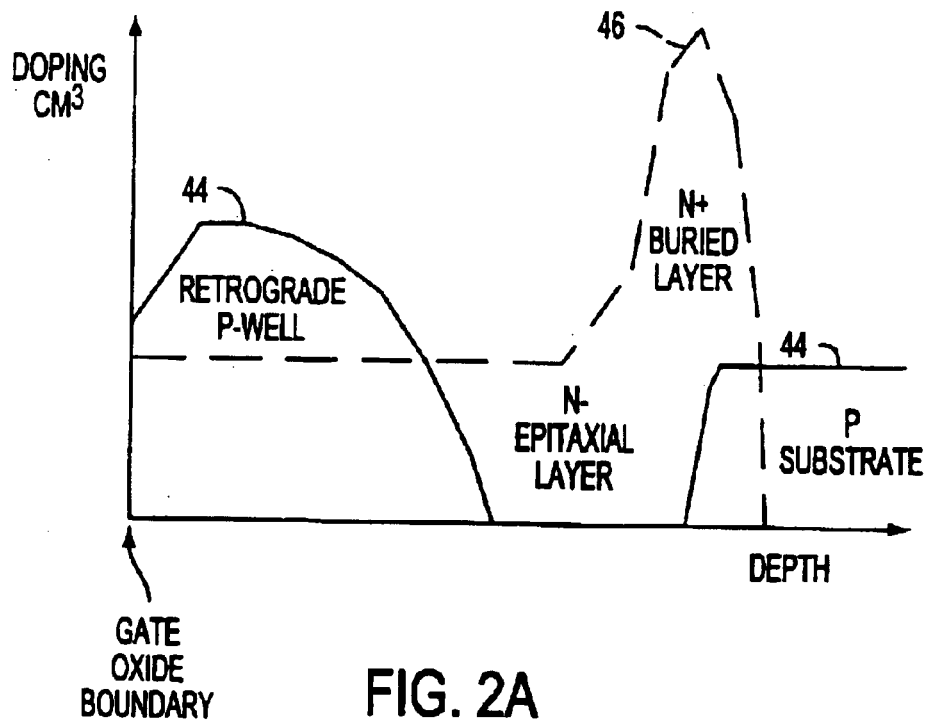
FIGS. 2A–2B are graphs of the doping concentration of NMOS transistors with prior art retrograde wells.
Figure 2B:
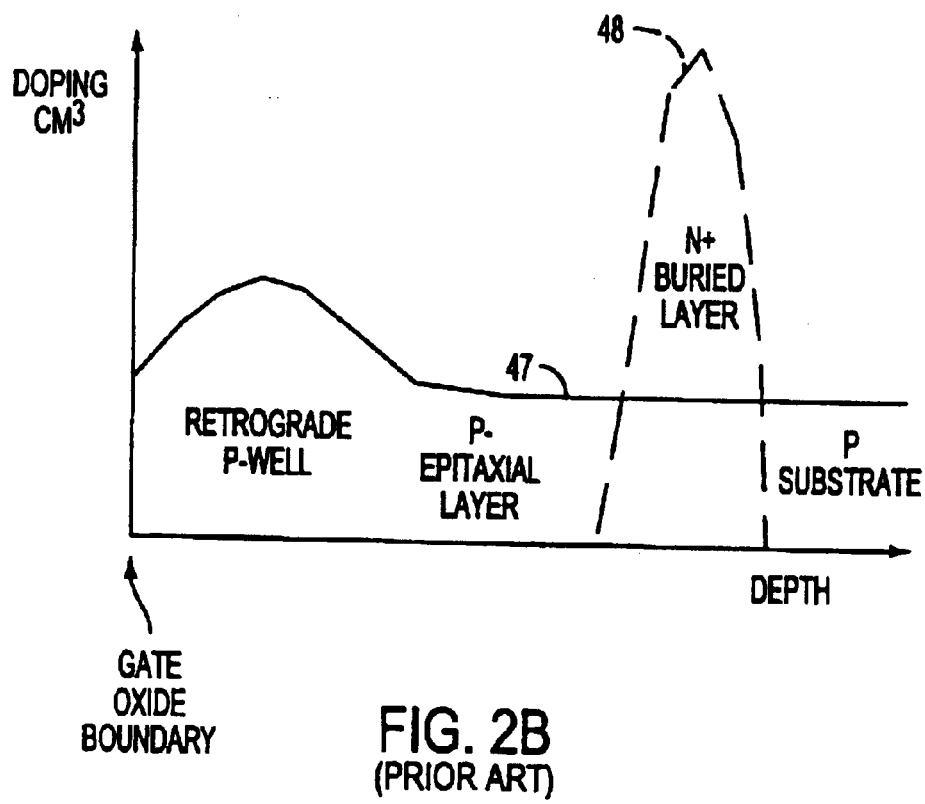
Figure 3A:
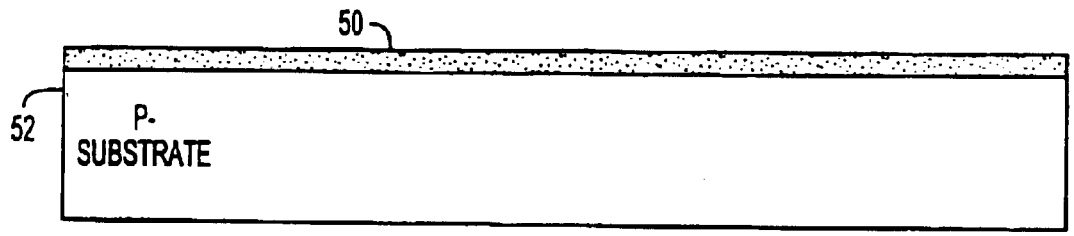
FIGS. 3A–3F are cross-sectional diagrams of process steps for the fabrication of an illustrative embodiment of a high voltage NMOS transistor with an up-retro well in accordance with the principles of the present invention.
Figure 3B:
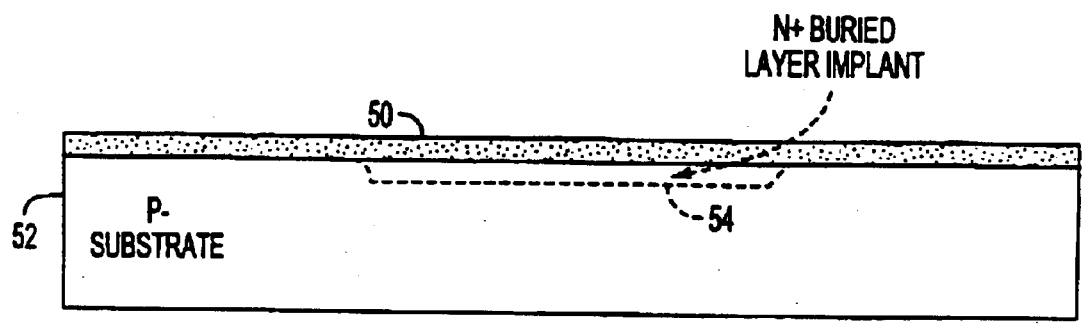

FIG. 3A shows the first step of the process during which a thin screen oxide layer 50 (e.g., 200–600 angstroms) is grown upon a silicon substrate. A portion 52 of the silicon P-substrate (doped with P-type dopants) is shown in FIG. 3A. A mask film such as photo-resist is applied to the surface of the oxide layer for selective implantation of an N+ buried layer. A high concentration of N-type dopants are then implanted into the P-substrate through the oxide layer to form a highly doped N+ buried layer as shown in FIG. 3B. The N-type dopant may be, for example, Antimony or Arsenic and may have an implant doping concentration of, e.g., $5 \times 10^{14}$ to $5 \times 10^{15}$ atoms/cm². The N-type dopants are implanted in the substrate only in region 54 where the mask is not present over the oxide. The mask is then removed from the oxide layer, and P-substrate 52 heated to a high temperature (e.g., 1250° C.) so that the N-type dopant implant atoms in region 54 form the N+ buried layer in region 58.

Figure 3C:
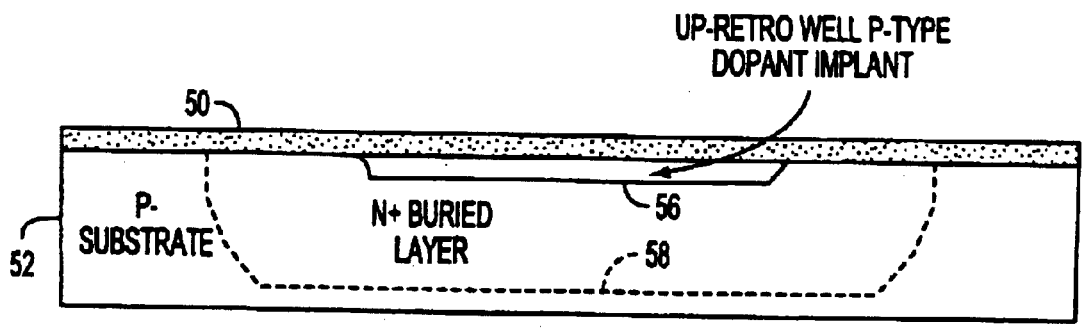

FIG. 3C shows N+ buried layer 58 after the heating step and the up-retro well dopant implant.

In the next step of the process, a mask film such as photo-resist is placed over oxide 50 so that P-type dopants for the up-retro well may be implanted into the substrate. Then P-type dopants for the up-retro well are implanted into the substrate through oxide layer 50 into region 56 as shown in FIG. 3C. For example, the P-type dopant may be Boron with a doping implant concentration of $5 \times 10^{11}$ to $5 \times 10^{14}$ atoms/cm² in region 56. Preferably, a P-type dopant such as Boron that has a diffusivity coefficient greater than the diffusivity coefficient of the N-type dopant in the N+ buried layer (e.g., Arsenic or Antimony) is chosen. A dopant with a higher diffusivity coefficient diffuses faster in silicon. The P-type dopant does not penetrate the region where the mask has been placed over the oxide. The silicon wafer may then be heated with a rapid thermal anneal (e.g., 1100° C. for 10–45 seconds with argon or nitrogen) so that any crystal damage from the implant step is annealed while minimizing diffusion of the dopants into the wafer. The rapid thermal anneal step is optional and is not needed for the formation of the up-retro well discussed below, particularly when the up-retro well implant is less than $10^{14}$ atoms/cm².

Figure 3D:
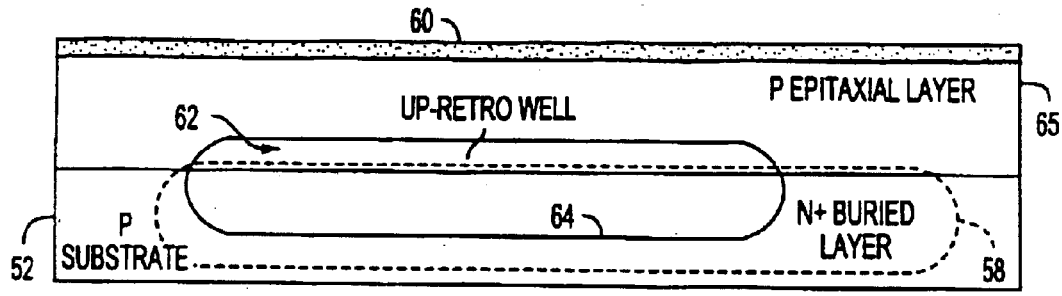

The results of the next step of the process are shown in FIG. 3D. Oxide layer 50 is removed from P-substrate 52 and then the surface of the substrate may be cleaned. Now P-type epitaxial layer 65 may be grown on the surface of substrate 52. P-type epitaxial layer 65 may be, for example, 4–12 microns thick with a P-type doping concentration of $3-8 \times 10^{15}$ atoms/cm³ (prior to diffusion of P-type dopants from the up-retro well implant in the epitaxial layer). MOS transistors of the present invention may use these epitaxial layer thickness and doping parameters for high voltage applications (e.g., more than 40 volts at the drain) without experiencing vertical punch-through. The relatively low doping concentration of the P-epitaxial layer provides for a low threshold voltage.

During deposition of epitaxial layer 65, the N-type dopants in buried layer 58 diffuse up into epitaxial layer 65 as shown in FIG. 3D. During deposition of epitaxial layer 65, the P-type dopants implanted into region 56 (FIG. 3C) diffuse up into epitaxial layer 65 and down into substrate 52 forming region 64 as shown in FIG. 3D. The high diffusivity coefficient of the P-type dopant in region 64 (e.g., Boron) causes it to diffuse faster than the N-type dopant in region 58. Therefore, region 64 expands upward more than N+ buried layer region 58. Up-retro well 62 is the portion of region 64 above N+ buried layer 58 that is not overlapped by N+ buried layer 58 in FIGS. 3D–3F.

Once the epitaxial layer has been formed, screen oxide layer 60 may be formed over it as shown in FIG. 3D. Now further steps involving the formation of the transistor may be performed. Highly doped N+ type and P+ type sinkers may be formed in the high voltage transistor of the present invention, such as N+ Sinker region 72 in FIG. 3E, to isolate the transistor. Sinker region 72 is an N-type region that has a high N-type doping concentration. Sinker 72 provides a low resistance electrical contact to N+ buried layer 58 from the surface of epitaxial 65 layer. A region of silicon that has a high concentration of P-type or N-type dopants has a higher conductivity than a region of silicon with a low concentration of P-type or N-type dopants.

Figure 3E:
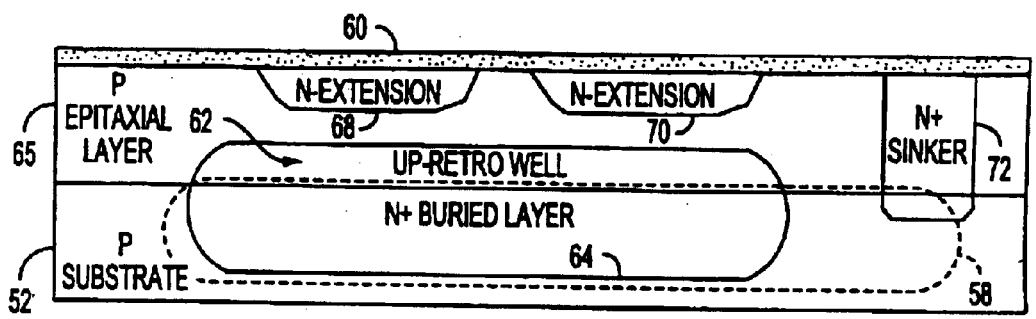

N-type extension regions 68 and 70 may be formed in the high voltage transistor of FIG. 3E using N-type field implants. The N-extension regions increase the breakdown voltage of the source-to-body and drain-to-body junctions.

During the formation of the N-extension regions, N-type dopants are implanted into epitaxial layer 65. The silicon wafer is then heated so that the N-type dopants diffuse down into epitaxial layer 65. During this heating process (and during subsequent heating procedures) the P-type dopants in region 64 continue to diffuse down into substrate 52 and up into epitaxial layer 65 causing up-retro well 62 to expand upward. The net P-type doping concentration in up-retro well region 62 decreases toward its upper boundary (see FIG. 5A). The N-extension regions should not penetrate beyond the lower boundary of epitaxial layer 65, and are preferably shallow compared to the thickness of the epitaxial layer. The N-extension regions may, for example, have a thickness of 0.4–1.0 microns for a 4–12 micron epitaxial layer. The N-extension regions may, for example, have an N-type doping concentration at the surface of the epitaxial layer of about $1 \times 10^{15} - 5 \times 10^{17}$ atoms/cm$^3$. N-type low doped drain (LDD) regions (not shown) may be formed on the source and/or the drain side of the transistor of FIGS. 3E–3F instead of the N-extension regions.

Figure 3F:
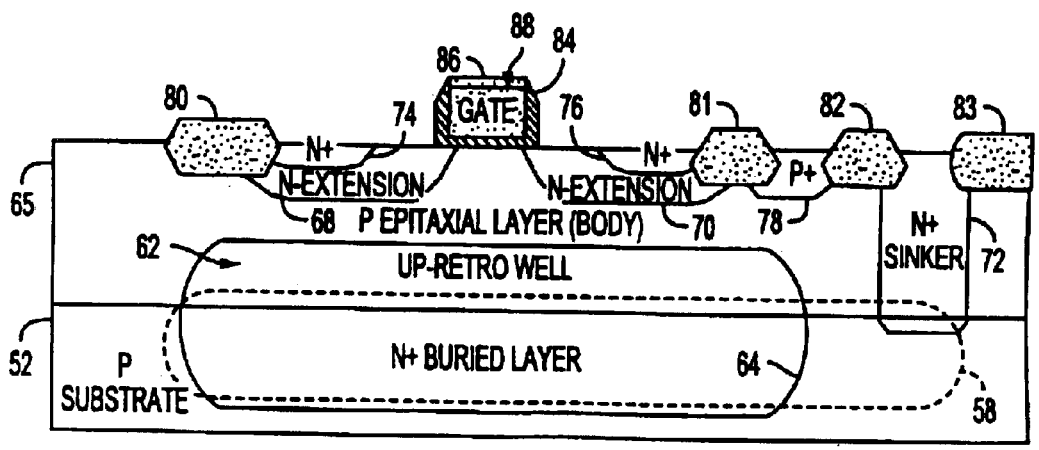

Selective oxidation (deposition, masking, and etching) may be performed using silicon nitride to form oxide regions 80–83 in FIG. 3F. Oxide layer 60 may be selectively etched to form gate oxide layer 84. If desired, oxide layer 60 may be removed and further gate oxidation performed to form gate oxide layer 84. Polysilicon deposition and doping may be performed to create polysilicon 88 which is the gate of the transistor. A layer of silicide 86 (WSi$_x$) may be formed over the gate to reduce the resistance of the gate. Polysilicon and silicide etching may be performed to form the gate of the transistor as shown in FIG. 3F. Further, highly doped N+ source and drain regions 74 and 76 may be formed in N-extension regions 68 and 70 as shown in FIG. 3F. N+ regions 74 and 76 may, for example, be doped with Arsenic. Also, a highly doped P+ body implant may be grown in region 78 as shown in FIG. 3F to form a low resistance contact to region of P-epitaxial layer 65 which is the body region of the transistor. Region 78 may be doped, for example, with Boron or BF$_2$.

The region of P-epitaxial layer 65 which is the body of the transistor of FIG. 3F (to the left of sinker 72) is not coupled electrically to the drain or the source. Also, the drain, source, and body are isolated from substrate 52 and buried layer 58. Also, regions 68 and 70 are symmetrical, and regions 74 and 76 are symmetrical. Therefore, the transistor of FIG. 3F may be used as a pass transistor because N-type regions 74/68 and N-type regions 76/70 may be used interchangeably as the source and the drain of the transistor. Also, the transistor of FIG. 3F has a low output capacitance since it is isolated from the substrate and buried layer.

Figure 5A:
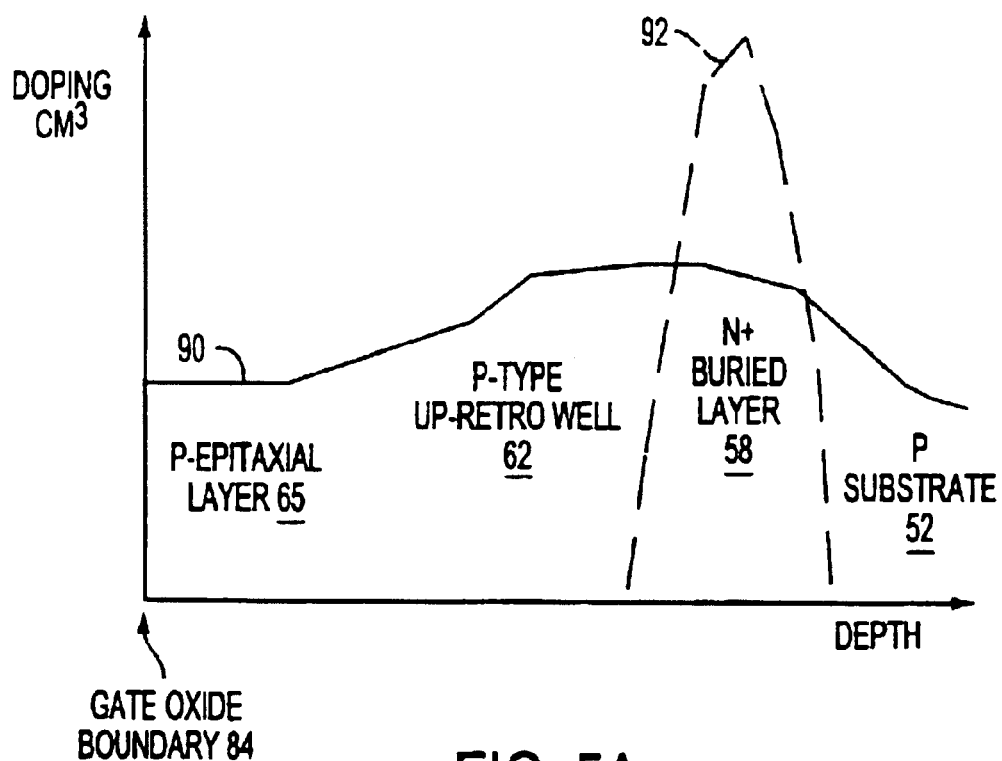
FIG. 5A is a graph of the doping concentration through a vertical cross section of the NMOS transistor of FIG. 3F.

The graph of FIG. 5A illustrates example doping concentrations for a cross section of the high voltage transistor of FIG. 3F below gate oxide 84 between N-extension regions 68 and 70. In FIG. 5A, the concentration of P-type dopants in shown by solid line 90, and the concentration of N-type dopants is shown by dotted line 92. Buried layer 58 has P-type dopants from region 64. However, buried layer 58 is N-type because the concentration of N-type dopants is greater than the concentration of P-type dopants in this region.

FIG. 5A shows that the doping concentration of P-type dopants in P-epitaxial layer 65 is low at the gate-oxide boundary on the left side of the graph. A low doping concentration below the gate allows the transistor to have a low threshold voltage. If desired, the P-type doping concentration of epitaxial layer 65 may be higher for further protection against drain-source punch-through at the expense of an increase in threshold voltage and a reduction in breakdown voltage. Drain-source punch-through can occur when the depletion regions of the drain and the source touch each other in the body region causing unwanted current to flow between the drain and the source.

The concentration of P-type dopants increases deeper into the epitaxial layer in the region of the up-retro well (moving to the right in the graph of FIG. 5A). The gradual increase in doping concentration is due to the diffusion of the P-type dopants into the P-epitaxial layer from region 64 during the heating steps. The increased concentration of P-type dopants in up-retro well 62 minimizes the expansion of the drain (region 68 or 70) and buried layer (region 58) depletion regions into epitaxial layer 65.

Vertical punch-through can occur when the drain and buried layer depletion regions meet in the body region as the drain voltage of the transistor increases. The up-retro well allows the transistor of the present invention to operate at high voltages without experiencing vertical punch-through between the drain and the buried layer even when the epitaxial layer is relatively thin. The increased concentration of P-type dopants in up-retro well 62 is deep enough in the epitaxial layer to have no effect on the surface doping in the body region and no effect on the threshold voltage. Thus, the up-retro well allows an NMOS transistor of the present invention to be formed with a thin epitaxial layer, to turn on at a low threshold voltage, and to operate properly at high voltages without experiencing vertical punch-through.

The doping concentration of P-type dopants in up-retro well 62 should be set to balance vertical punch-through and breakdown voltage constraints. The doping concentration of the up-retro well may be increased to add further protection against vertical punch-through. However, increasing the doping concentration of the up-retro well reduces the breakdown voltage between the body and the N+ buried layer. Therefore, the concentration of dopants in the up-retro well should be chosen so that neither vertical punch-through nor breakdown occurs at the expected operating voltages.

Figure 4A:
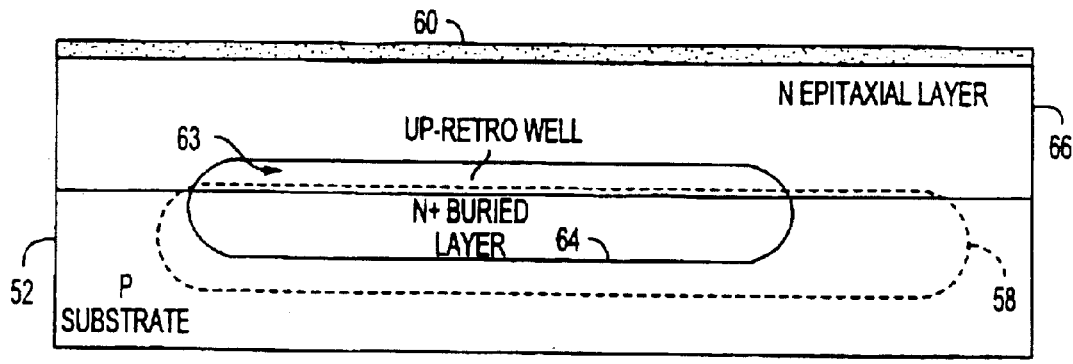
FIGS. 4A–4C are cross-sectional diagrams of process steps for the fabrication of another illustrative embodiment of a high voltage NMOS transistor with an up-retro well in accordance with the principles of the present invention.
Figure 4B:
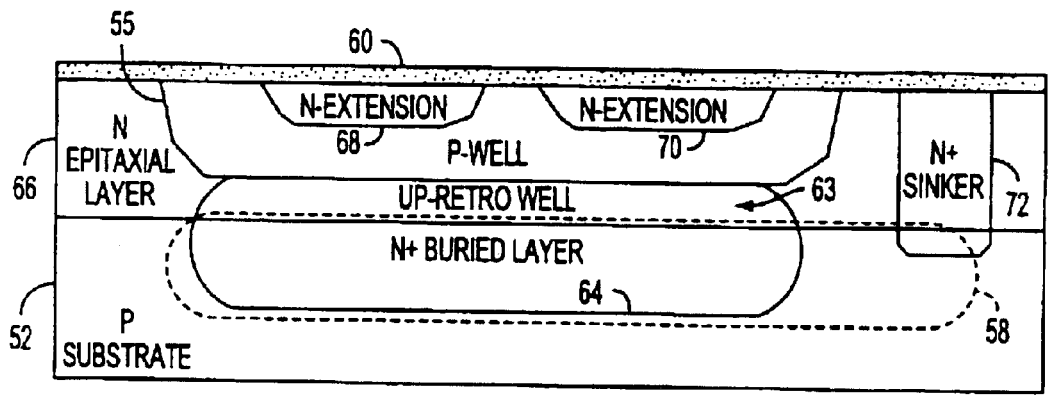
Figure 4C:
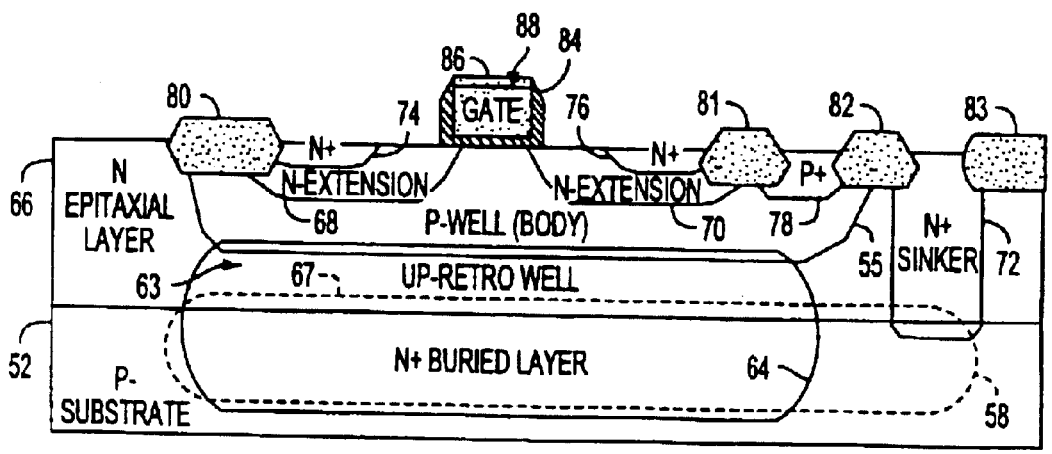

High voltage NMOS transistors with an up-retro well may be formed in an N-type epitaxial layer on a P-type substrate. The steps and doping concentrations shown and described with respect FIGS. 3A–3C are the same initial steps used in this embodiment of the invention. Further steps of this embodiment are shown in FIGS. 4A–4C. These steps involve the formation of an N-type epitaxial layer on the P-type substrate, and the subsequent formation of a P-type well (P-well) in the N epitaxial layer. Source and drain regions may be formed in the P-well. The P-well is the body region of the transistor. P-type dopants implanted in the P-substrate diffuse up into the epitaxial layer to form an up-retro well.

The net P-type doping concentration in a P-type up-retro well region in an N-type epitaxial layer (e.g., the embodiment of FIGS. 4A–4C) can be less than the net P-type doping concentration a P-type up-retro well region in an P-type epitaxial layer (e.g., the embodiment of FIGS. 3D–3F). In an embodiment such as FIGS. 3D–3F that have a P-type epitaxial layer, the P-type dopants from the P-type up-retro well implant that diffuse into epitaxial layer 65 in region 64 combine with the P-type dopants present throughout P-epitaxial layer 65 thereby forming a greater net P-type doping concentration in up-retro well 62.

However, the up-retro well of FIGS. 4A–4C increases protection against vertical punch-through between the drain and the buried layer in a thin epitaxial layer (e.g., 4–12 microns thick) by moving the PN junction below the body region deeper into the epitaxial layer to the boundary of the buried layer. Thus, an up-retro well in an N-epitaxial layer of an NMOS transistor provides protection against vertical punch-through even if the net P-type doping concentration in the up-retro well is about the same as the net P-type doping concentration in the P-well body below the gate oxide. The doping concentration of the P-well can be set so that the transistor has a low threshold voltage. The high-voltage MOS transistor of FIGS. 4A–4C may be fabricated using processes that are standard in low voltage sub-micron CMOS and BiCMOS process technology. The transistor of FIG. 4C also has low output capacitance and can operate as a pass transistor.

The steps shown in FIGS. 4A–4C are now described in detail. N-type dopants for the buried layer and P-type dopants for the up-retro well are implanted in P-substrate 52 as shown and described with respect to FIGS. 3A–3C. Oxide layer 50 is then removed and the wafer may be cleaned. Then, N-type epitaxial layer 66 is grown on P-substrate 52 as shown in FIG. 4A. The N-type epitaxial layer may be, for example, 4 to 12 microns thick with a doping concentration of $1-8\times10^{15}$ atoms/cm$^3$ for applications of greater than 40 volts. During deposition of epitaxial layer 66, the N-type dopants in N+ buried layer 58 and the P-type dopants in region 64 (from the implant in region 56) diffuse up into epitaxial layer 66 as shown in FIG. 4A. The P-type dopants in region 64 penetrate farther up into epitaxial layer 66 than the N-type dopants in region 58 as shown in FIG. 4A because the P-type dopants in region 64 have a higher diffusivity coefficient than the N-type dopants in buried layer 58. Up-retro well region 63 is the portion of region 64 that has expanded farther into epitaxial layer 66 than region 58.

Screen oxide layer 60 may be grown on epitaxial layer 66. P-type dopants may now be implanted through oxide layer 60 to form P-well 55. The silicon wafer may then be heated so that the P-type dopants diffuse down into N-epitaxial layer 66 to form P-well 55 as shown in FIG. 4B. During this heating step and subsequent heating steps, the P-type dopants in region 64 continue to expand upward toward P-well 55 and downward into substrate 52. The P-type dopants in up-retro well region 63 are more concentrated than the N-type dopants in epitaxial layer 66. Therefore, up-retro well region 63 is P-type. This is advantageous because it moves the PN junction below the body region down to the N+ buried layer-to-up-retro well boundary 67 in FIG. 4C.

Figure 5B:
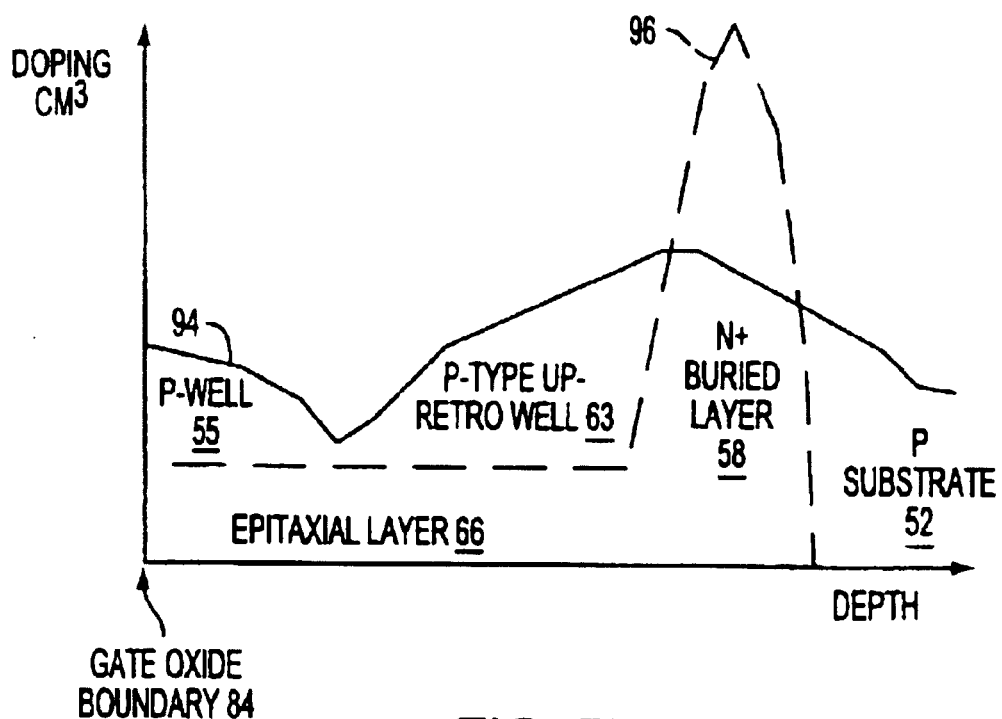
FIG. 5B is a graph of the doping concentration through a vertical cross section of the NMOS transistor of FIG. 4C.

The P-type doping concentration in up-retro well 63 decreases farther up into epitaxial layer 66 (toward the gate) because the dopants become more spread out as they diffuse upwardly as shown in FIG. 5B. If desired, the P-type doping concentration of P-well 55 may be higher for further protection against drain-source punch-through at the expense of an increase in threshold voltage and a reduction in breakdown voltage.

Highly doped N+ and P+ sinkers such as N+ sinker 72 may be implanted into epitaxial layer 66 to form a low resistance contact to the N+ buried layer as shown in FIG. 4B. N-type extension regions 68 and 70 may be formed in P-well 55 using N-type field implants as shown in FIG. 4B. The N-extension regions should not penetrate beyond the lower boundary of the epitaxial layer, and are preferably shallow compared to the thickness of the epitaxial layer. The N-extension regions may, for example, have a thickness of 0.4–1.0 microns for a 4–12 micron epitaxial layer. The N-extension regions may, for example, have a surface doping concentration of about $5\times10^{16}-1\times10^{17}$ atoms/cm$^3$. The N-extension regions may also be formed after the formation of gate oxide 84. N-type low doped drain (LDD) regions (not shown) may be formed on the source and/or the drain side instead of the N-extension regions.

Selective oxidation (deposition, masking, and etching) may be performed using silicon nitride to form oxide regions 80–83 in FIG. 4C. Oxide layer 60 may be selectively etched to form gate oxide layer 84. If desired, oxide layer 60 may be stripped and further gate oxidation performed to form gate oxide layer 84. In addition, polysilicon deposition and doping may be performed to form polysilicon 88 which is the gate of the transistor. A layer of silicide 86 may be formed over the gate to reduce the resistance of the gate. Further, highly doped N+ source and drain regions 74 and 76 may be grown in N-extension regions 68 and 70 as shown in FIG. 4C. The N-type dopant used for regions 74 and 76 may, for example, be Arsenic. Also, a highly doped P-type (P+) body implant 78 may be grown in region 68 as shown in FIG. 4C to form a low resistance contact to body region P-well 55.

The transistor of FIG. 4C has symmetrical and interchangeable source and drains regions (i.e., regions 68/74 and regions 70/76). Also, the drain, source, and body region 55 are fully isolated from substrate 52 and buried layer 58, and body 55 is not tied electrically to the source or the drain of the transistor. Therefore, the transistor of FIG. 4C can operate as a pass transistor. The isolation of the drain, source, and body regions also provides low output capacitance.

FIG. 5B is graph that illustrates an example of doping concentrations for a cross section of the high voltage transistor of FIG. 4C below gate oxide 84 between N-extension regions 68 and 70. In FIG. 5B, the concentration of P-type dopants is shown by solid line 94, and the concentration of N-type dopants is shown by dotted line 96. Buried layer 58 has P-type dopants from region 64. However, buried layer 58 is N-type because the concentration of N-type dopants is greater than the concentration of P-type dopants in this region. Epitaxial layer 66 is P-type in the cross section shown in FIG. 5B because the concentration of P-type dopants from P-well 55 and up-retro well 63 is greater than the concentration of N-type dopants.

FIG. 5B shows that the concentration of P-type dopants in P-well 55 is highest at the gate-oxide boundary on the left side of the graph. The doping concentration of the P-well may be relatively low so that the transistor has a low threshold voltage and a higher breakdown voltage.

The concentration of P-type dopants in the P-well decreases farther down into the epitaxial layer (to the right in FIG. 5B). The concentration of P-type dopants increases in P-type up-retro well region 63. Without up-retro well 63, a PN junction would exist between P-well body region 55 and the N-type region of N-epitaxial layer 66 below the P-well. Up-retro well 63 shifts the PN junction deeper into the epitaxial layer to where up-retro well 63 meets N+ buried layer 58 at boundary 67 (FIG. 4C). This provides greater distance between the drain-to-body PN junction and the next PN junction beneath the drain. The greater distance between these PN junctions reduces the likelihood of vertical punch-through between the drain and the N+ buried layer at drain high voltages (even if the net P-type doping concentration in up-retro well 63 is made to be about the same as the peak net P-type doping concentration in P-well 55 below gate oxide 84). The doping concentration of P-type dopants in up-retro well 63 may be increased to provide further protection against vertical punch-through at the expense of a reduced breakdown voltage between up-retro well region 63 and N+ buried layer 58.

Figure 6A:
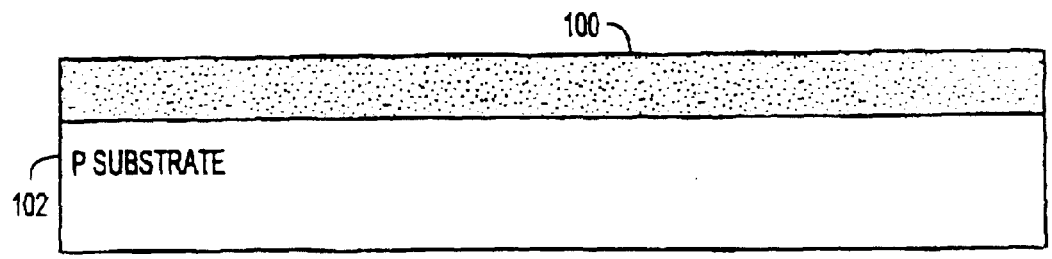
FIGS. 6A–6C are cross-sectional diagrams of process steps for the fabrication of illustrative embodiments of a high voltage MOS transistor with an up-retro well in accordance with the principles of the present invention.
Figure 6B:
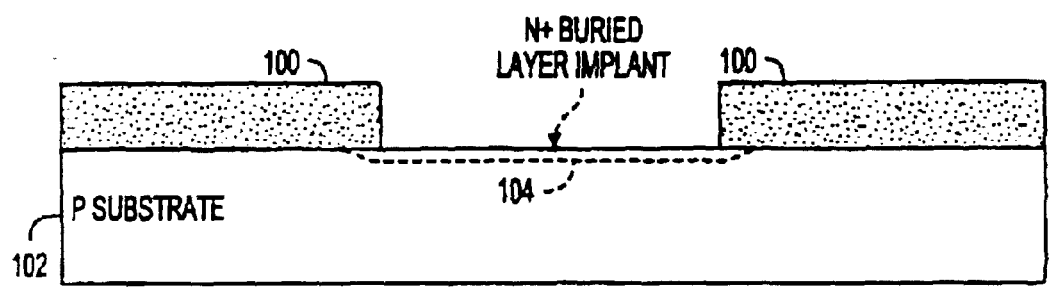
Figure 6C:
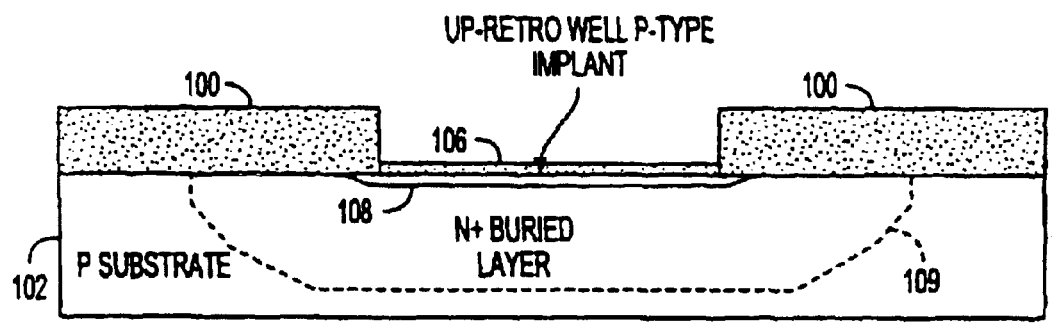

Further process steps for the formation of another embodiment of the present invention are shown in FIGS. 6A–6C. If desired, the steps of FIGS. 6A–6C may be used instead of the steps shown in FIGS. 3A–3C to form the transistors shown in FIGS. 3F and 4C. In the process steps of FIGS. 6A–6C, thick oxide 100 is formed over the substrate instead of thin oxide 50. Referring to FIG. 6A, thick oxide layer 100 is initially grown on top of P-type substrate 102. Oxide layer 100 may, for example, have a thickness of 4000–10,000 angstroms. A mask layer is then placed over oxide layer 100, and the middle portion of oxide layer 100 is etched away as shown in FIG. 6B. A high concentration of N-type dopants are then implanted in substrate 102 to form an N+ buried layer. The implant N-type doping concentration may be, for example, $5\times10^{14}$–$5\times10^{15}$ atoms/cm$^2$. The N-type dopants only penetrate substrate 102 in region 104 where oxide 100 has been etched away as shown in FIG. 6B. The mask layer prevents the dopants from penetrating substrate 102 elsewhere. The mask layer is then removed from oxide layer 100.

Substrate 102 is then heated to a high temperature (e.g., 1250° C.) so that the N-type dopant implants may be driven into P-substrate 102 to form N+ buried layer 109. Buried layer 109 is shown in FIG. 6C after the heating step and after the up-retro well implant step. Substrate 102 is now re-oxidized to form a thin oxide layer 106 between the two portions of thick oxide 100 as shown in FIG. 6C. Thin oxide layer 106 may have a thickness of, for example, 500–2500 angstroms. After re-oxidation, P-type dopants (e.g., Boron) are implanted through thin oxide layer 106. The P-type dopants penetrate substrate 102 in region 108 as shown in FIG. 6C. The P-type dopants may be implanted into region 108, for example, with an energy of 100–180 KeV. The dopants implanted into region 108 may have a P-type implant doping concentration, for example, of $5\times10^{11}$–$5\times10^{14}$ atoms/cm$^2$.

Substrate 102 may then be heated with a rapid thermal anneal (e.g., 1100° C. for 10–45 seconds with argon or nitrogen) so that any crystal damage from the implant step is annealed while minimizing diffusion of the dopants into the wafer. The rapid thermal anneal is an optional step as with the previous embodiments. Oxide layers 100 and 106 may then be removed from substrate 102. The subsequent processing steps and doping concentrations of the embodiment of FIGS. 6A–6C are the same as in previous embodiments described with respect to FIGS. 3D–3F and FIGS. 4A–4C. An N-type or P-type epitaxial layer may be grown on substrate 102 so that the implanted P-type dopants diffuse up into the epitaxial layer to form an up-retro well. The final NMOS transistor layout may look like FIG. 3F or FIG. 4C. Also, the thick oxide process of FIGS. 6A–6C may be used to form a PMOS transistor with an N-type substrate and an up-retro well of the present invention in a P-type or N-type epitaxial layer as shown and described below with respect to FIGS. 7A–7F and FIGS. 8A–8C.

High voltage PMOS transistors with a substrate implant may include an N-type up-retro well. PMOS transistors of the present invention may have an N-type epitaxial layer (FIGS. 7D–7F) or a P-type epitaxial layer (FIGS. 8A–8C) on an N-type substrate. A PMOS transistor of the present invention with an N-type epitaxial layer may have an N-type up-retro well that increases the net concentration of N-type dopants in a portion of the N-epitaxial layer above the substrate. The increased doping concentration in the N-type up-retro well reduces the expansion of the drain and P+ buried layer depletion regions in the up-retro well at high drain voltages, reducing the likelihood of vertical punch-through between the drain and the P+ buried layer.

A PMOS transistor of the present invention with a P-type epitaxial layer may have an N-type up-retro well that the causes the region of the epitaxial layer between the N-well (the body region of the transistor) and the P+ buried layer to be doped N-type. The N-type up-retro well moves the PN junction from beneath the N-well down to the upper boundary of the P+ buried layer. The up-retro well-to-buried layer PN junction is deeper in the epitaxial layer than an N-well-to-epitaxy PN junction. The up-retro well reduces the likelihood of vertical punch-through at high drain voltages because the up-retro well-to-buried layer PN junction is a farther distance from the drain-to-body (N-well) PN junction.

Figure 7A:
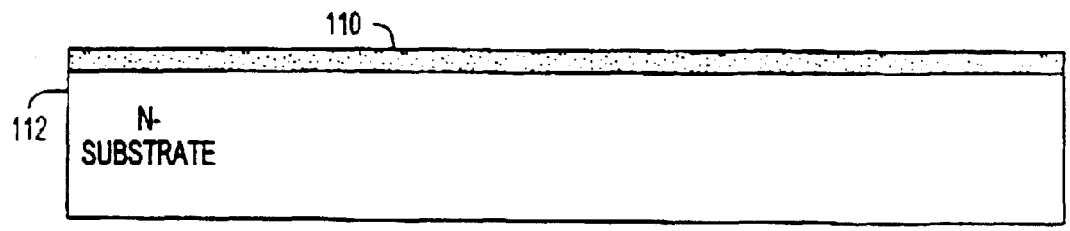
FIGS. 7A–7F are cross-sectional diagrams of process steps for the fabrication of an illustrative embodiment of a high voltage PMOS transistor with an up-retro well in accordance with the principles of the present invention.
Figure 7B:
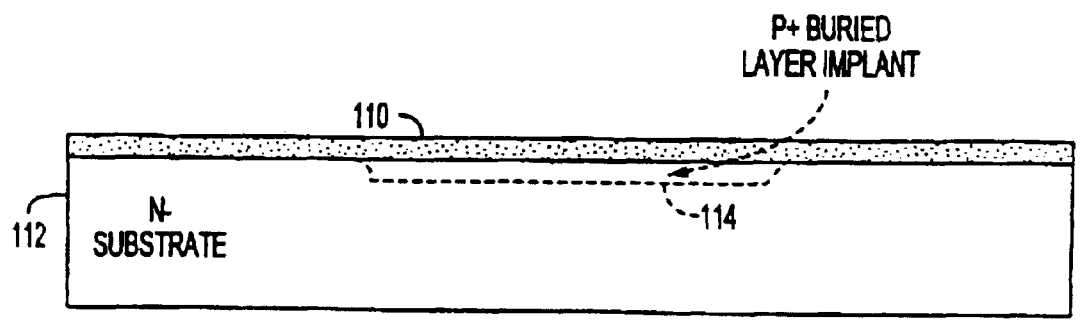
Figure 7C:
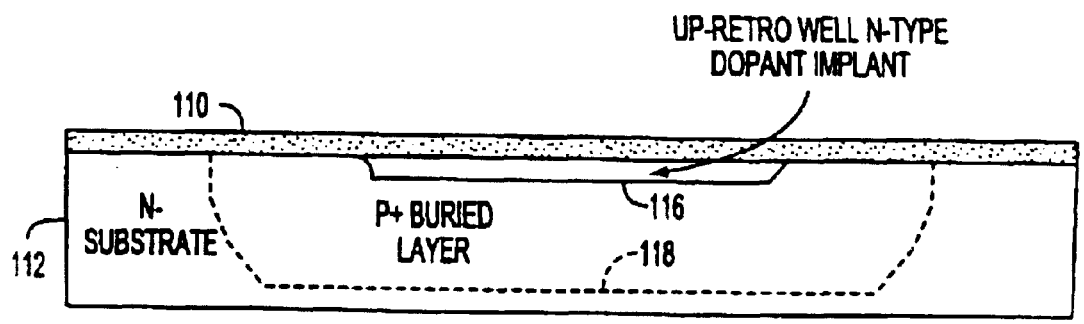
Figure 7D:
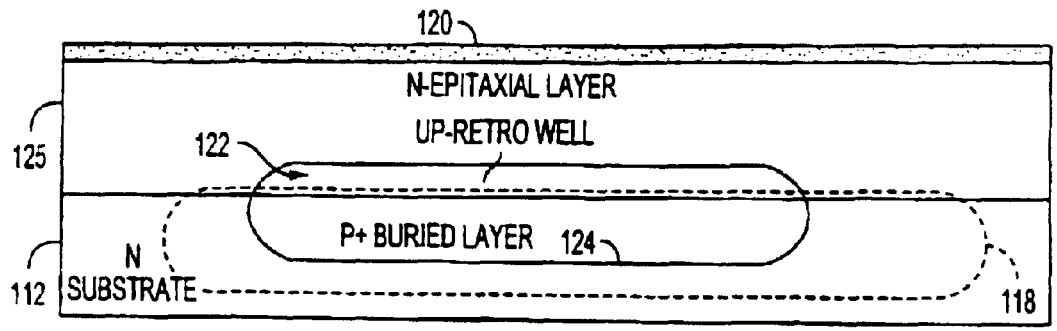
Figure 7E:
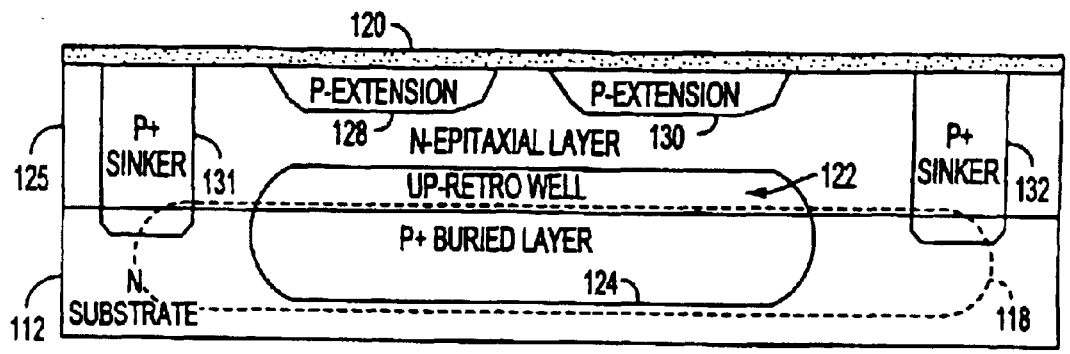
Figure 7F:
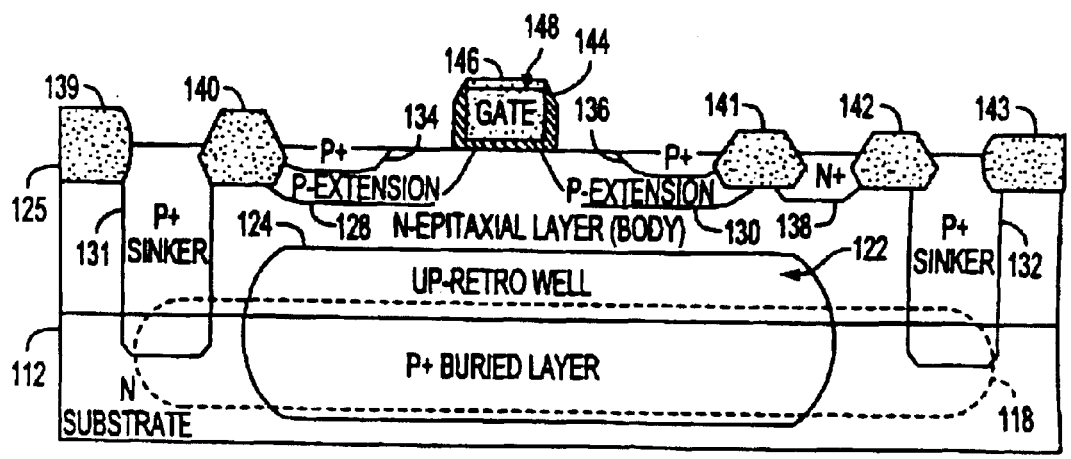
Figure 8A:
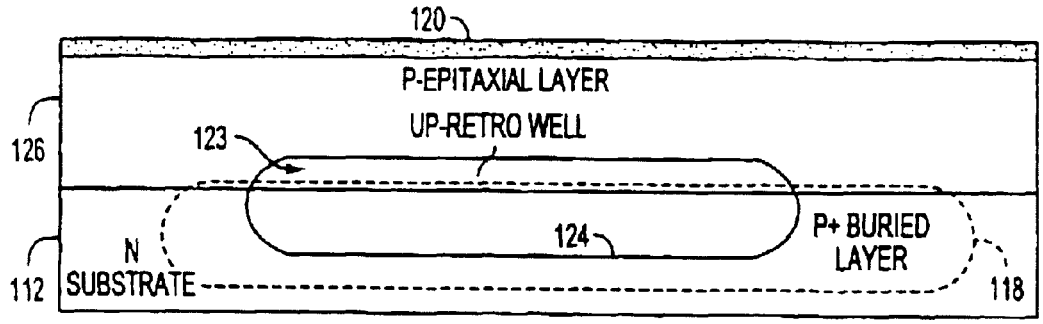
FIGS. 8A–8C are cross-sectional diagrams of process steps for the fabrication of another illustrative embodiment of a high voltage PMOS transistor with an up-retro well in accordance with the principles of the present invention.
Figure 8B:
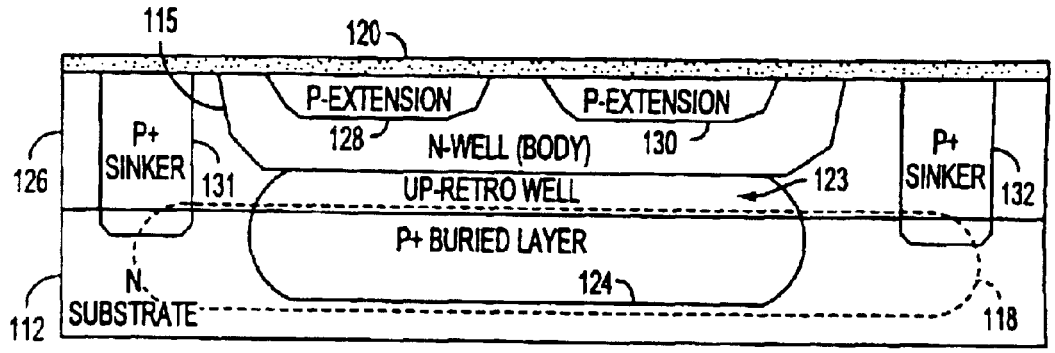
Figure 8C:
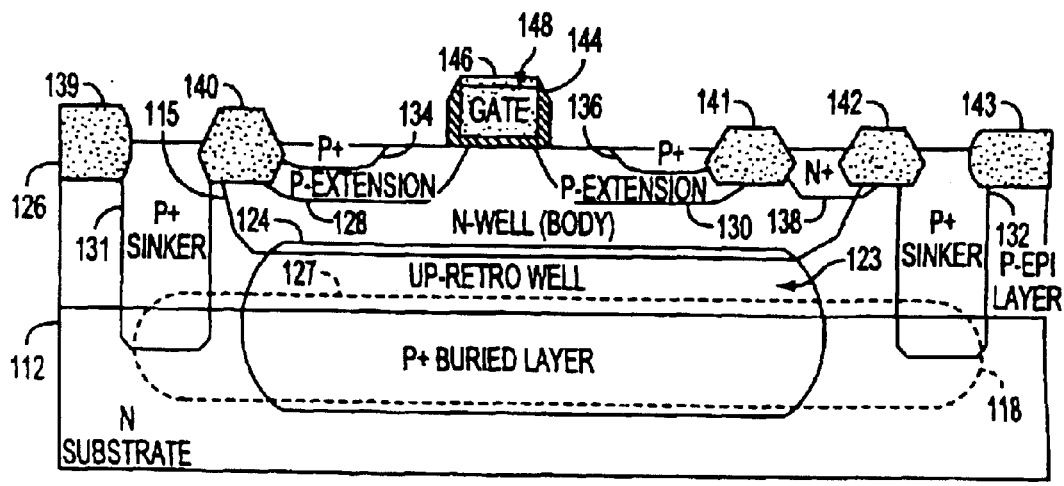

The PMOS transistors of FIGS. 7F and 8C may be used as pass transistors, and may have a low threshold voltage and low output capacitance. The high-voltage PMOS transistors of FIGS. 7A–7F and 8A–8C may be fabricated using processes that are standard in low voltage sub-micron CMOS and BiCMOS process technology.

The initial processing steps of the PMOS transistor embodiments of the present invention are shown in FIGS. 7A–7C. Initially, screen oxide layer 110 (e.g., 200–600 angstroms thick) is grown on N-type substrate 112 as shown in FIG. 7A. A mask layer is then applied to the surface of oxide layer 110. The mask layer has an opening for the implantation of P+ buried layer dopants in substrate 112. Highly concentrated P-type dopants (e.g., Boron or BF$_2$ at an implant P-type doping concentration of $1\times10^{12}$ to $2\times10^{15}$ atoms/cm$^2$) are then implanted through screen oxide layer 110 into region 114 as shown in FIG. 7B. After the mask layer is removed, substrate 112 may be heated so that the P-type dopants diffuse down into region 118. P+ Buried layer 118 is shown in FIG. 7C after the heating step and after the implantation of up-retro well dopants.

Another mask layer may then be applied to the surface of oxide 110 to mask the implantation of N-type dopants into substrate 112. Fast diffusing N-type dopants such as phosphorous (e.g., at an implant N-type doping concentration of $5\times10^{12}$ to $5\times10^{14}$ atoms/cm$^2$) may be implanted through the mask layer into region 116 as shown in FIG. 7C for the formation of the up-retro well. The mask layer is then removed and substrate 112 is heated with a rapid thermal anneal (e.g., 1100° C. for 10–45 seconds with argon or nitrogen) so that any crystal damage from the implant step is annealed while minimizing diffusion of the dopants into the wafer. The anneal step is optional as with the previous NMOS embodiments.

An epitaxial layer may now be grown upon the surface of N-substrate 112 after oxide layer 110 has been removed and substrate 112 is cleaned. The epitaxial layer may be N-type as shown in FIGS. 7D–7F, or P-type as shown in FIGS. 8A–8C. Presently, the embodiment of FIGS. 7D–7F is discussed. During the formation of N-epitaxial layer 125 as shown in FIG. 7D, the N-type dopants that were implanted into region 116 now diffuse into epitaxial layer 125 and substrate 112 in region 124. Also, P+ buried layer 118 expands into epitaxial layer 125. After formation of epitaxial layer 125, oxide layer 120 may be grown on top of it.

The N-type dopants in region 124 diffuse farther into epitaxial layer 125 than the P-type dopants in P+ buried layer 118 forming up-retro well region 122. The N-type dopants in region 124 diffuse farther into epitaxial layer 125 than the P-type dopants in region 118 because the N-type dopants in region 124 have a greater diffusivity coefficient than the P-type dopants in region 118. For example, Phosphorous has a greater diffusivity coefficient than Boron and, therefore, diffuses faster than Boron. The concentration of P-type dopants is greater than the concentration of N-type dopants in P+ buried layer 118. Therefore, P+ buried layer 118 is P-type.

Highly doped N+ and P+ sinkers such as P+ sinkers 131 and 132 may be implanted into epitaxial layer 125 to form a low resistance contact to the P+ buried layer and to isolate the transistor as shown in FIG. 7E. P+ sinkers 131 and 132 have a high net P-type doping concentration. P-type extension regions 128 and 130 may be formed in the high voltage transistor of FIG. 7E using P-type field implants. The P-extension regions increase the breakdown voltage of the source-to-body and drain-to-body junctions. During the formation of the P-extension regions, P-type dopants are implanted into epitaxial layer 125, and then the silicon wafer is heated so that the P-type dopants diffuse down into the epitaxial layer. The P-extension regions should not penetrate beyond the lower boundary of the epitaxial layer, and are preferably shallow compared to the thickness of the epitaxial layer. During this heating process (and during subsequent heating procedures), the N-type dopants in region 124 continue to diffuse down into substrate 112 and up into epitaxial layer 125 causing up-retro well 122 to expand upward.

Selective oxidation (deposition, masking, and etching) may be performed using silicon nitride to form oxide regions 139–143. Oxide layer 120 may be selectively etched to form gate oxide layer 144. If desired, oxide layer 120 may be removed and further gate oxidation performed to form gate oxide layer 144. In addition, polysilicon deposition and doping may be performed to form polysilicon region 148 which is the gate of the transistor. A layer of silicide 146 may be formed over the gate to reduce the resistance of the gate.

Highly doped P+ (P-type) regions 134 and 136 may now be formed in the P-extension regions as shown in FIG. 7F. Regions 134 and 136 have a high net concentration of P-type dopants. Regions 134 and 136 may interchangeably serve as the source or the drain of the transistor. P-type low doped drain (LDD) regions (not shown) may be formed on the source and/or the drain side of the transistor of FIG. 7F (and FIG. 8C), instead of the P-extension regions. The N-type portion of epitaxial layer 125 between P+ sinkers 131 and 132 is the body region of the transistor. A region 138 which has a high net concentration of N-type dopants may be formed in epitaxial layer 125 for a low resistance contact to the body of the transistor.

The source and drain regions (regions 128/134 and regions 130/136) in FIG. 7F are symmetrical and interchangeable. The source, drain, and body regions are isolated from substrate 112 and P+ buried layer 118. The body region is not tied electrically to the source or the drain. Therefore, the transistor of FIG. 7F may be used as a pass transistor and has a low output capacitance.

Figure 9A:
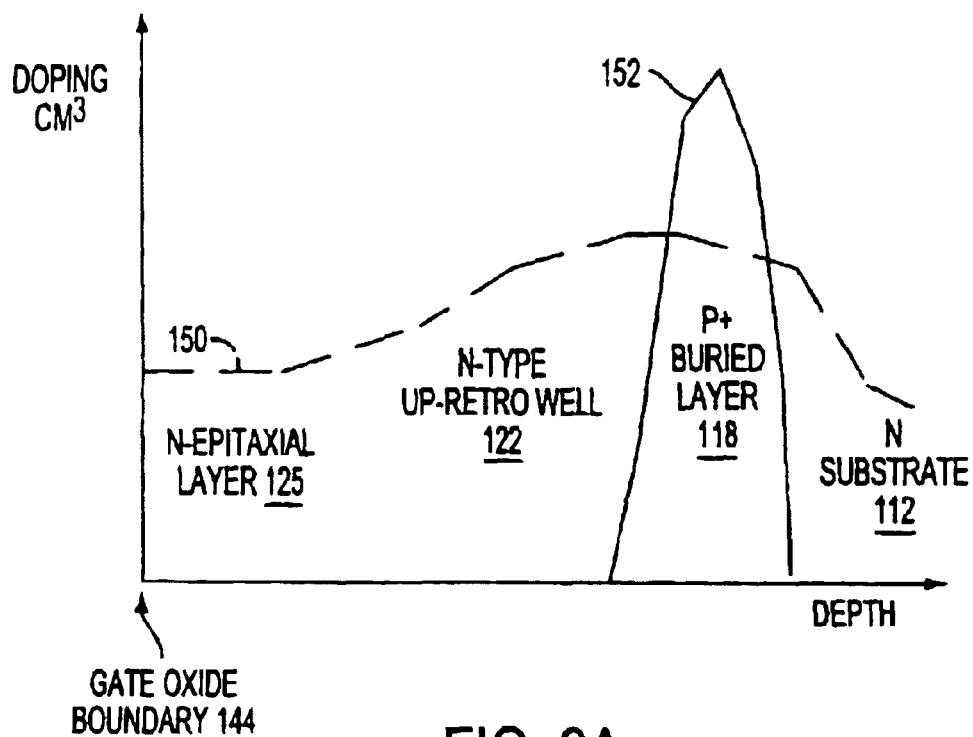
FIG. 9A is a graph of the doping concentration of a vertical cross section of the PMOS transistor of FIG. 7F.

FIG. 9A is graph that illustrates example doping concentrations for a cross section of the high voltage PMOS transistors of FIG. 7F below gate oxide 144 between P-extension regions 128 and 130. In FIG. 9A, the concentration of P-type dopants is shown by solid line 152, and the concentration of N-type dopants is shown by dotted line 150. Buried layer 118 has N-type dopants from region 124. However, buried layer 118 is P-type because the concentration of P-type dopants is greater than the concentration of N-type dopants in this region.

FIG. 9A shows that the net N-type doping concentration in N-epitaxial layer 125 is low at the gate oxide boundary on the left side of the graph. A low doping concentration below the gate allows the PMOS transistor to have a low threshold voltage. If desired, the net N-type doping concentration of epitaxial layer 125 may be higher for further protection against drain-source punch-through at the expense of an increase in threshold voltage and a reduction in breakdown voltage.

The net concentration of N-type dopants increases deeper into N-epitaxial layer 125 in the region of N-type up-retro well 122 (moving to the right in the graph of FIG. 9A). The gradual increase in doping concentration is due to the diffusion of the N-type dopants into epitaxial layer 125 from the N-type dopant implants in region 116 during the formation of the epitaxial layer and subsequent heating steps. The increased concentration of N-type dopants in up-retro well 122 minimizes the expansion of the drain and buried layer depletion regions into epitaxial layer 125.

Vertical punch-through can occur when these depletion regions meet at high drain voltages. The up-retro well allows the PMOS transistor of the present to operate at a high drain voltage without experiencing vertical punch-through between the drain and the buried layer even when the epitaxial layer is relatively thin. The increased net concentration of N-type dopants in up-retro well 122 is deep enough in the epitaxial layer to have no effect on the surface doping in the body region and no effect on the threshold voltage. The up-retro well allows the high voltage PMOS transistor with an N-epitaxial layer to be formed with a thin epitaxial layer, to turn on at a low threshold voltage, and to operate properly at high voltages without experiencing vertical punch-through. The doping concentration of N-type dopants in up-retro well 122 should be chosen to balance vertical punch-through and breakdown voltage constraints as with the NMOS embodiments.

FIGS. 8A–8C illustrate the steps to be performed subsequent to the steps shown in FIGS. 7A–7C for the formation of a PMOS transistor in a P-type epitaxial layer on an N-substrate with an N-type up-retro well. After P-type dopants have diffused into region 118 and N-type dopants have been implanted into region 116, oxide layer 110 may be removed and P-type epitaxial layer 126 may be grown on substrate 112 as shown in FIG. 8A. The N-type dopants in region 124 diffuse farther into epitaxial layer 126 forming up-retro well 123 for the reasons discussed above with respect to FIG. 7D. Up-retro well 123 is N-type because the concentration of N-type dopants in region 123 is greater than the concentration of P-type dopants in region 123. P+ buried layer 118 is P-type (including where it overlaps with region 124) because the concentration of P-type dopants in this region is greater than the concentration of N-type dopants.

N-well 115 may now be grown in epitaxial layer 126 for the formation of a PMOS device as shown in FIG. 8B. N-well 115 forms the body of the PMOS transistor. P-extension regions 128 and 130 may be formed in N-well 115 using field implants. Highly doped N+ and P+ sinkers such as P+ sinkers 131 and 132 may be implanted into epitaxial layer 126 to form a low resistance contact to the P+ buried layer and to isolate the transistor as shown in FIG. 8B. Now further steps may be performed to complete the formation of the PMOS transistor as shown in FIG. 8C. These steps are the same as shown and described above with respect to FIG. 7F.

The source and drain regions (regions 128/134 and regions 130/136) in FIG. 8C are symmetrical and interchangeable. The source, drain, and body 115 regions are isolated from substrate 112 and P+ buried layer 118. Body 115 is not tied electrically to the source or the drain. Therefore, the transistor of FIG. 8C may be used as a pass transistor and has a low output capacitance.

Figure 9B:
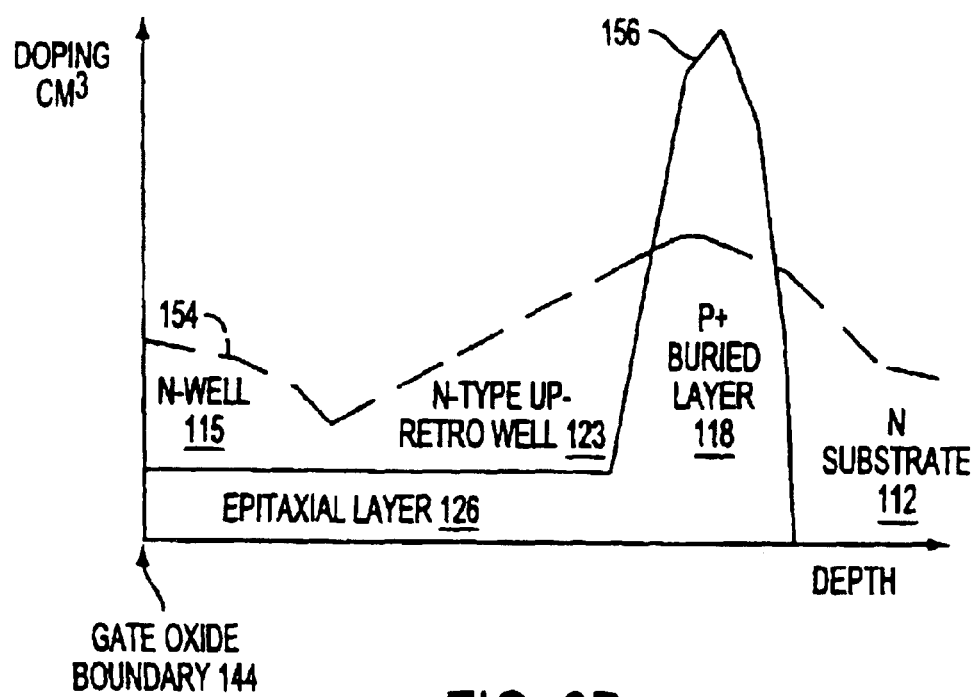
FIG. 9B is a graph of the doping concentration of a vertical cross section of the PMOS transistor of FIG. 8C.

FIG. 9B is graph that illustrates the net doping concentration for a cross section of the high voltage transistor of FIG. 8C below gate oxide 144 between P-extension regions 128 and 130. In FIG. 9B, the concentration of P-type dopants is shown by solid line 156, and the concentration of N-type dopants is shown by dotted line 154. Buried layer 118 has N-type dopants from region 124. However, P+ buried layer 118 is P-type because the concentration of P-type dopants is greater than the concentration of N-type dopants in this region. Epitaxial layer 126 is N-type in the cross section shown in FIG. 9B because the concentration of N-type dopants from N-well 115 and up-retro well 123 is greater than the concentration of P-type dopants.

FIG. 9B shows that the concentration of N-type dopants in N-well 115 is highest at the gate-oxide boundary on the left side of the graph. The doping concentration of the N-well may be relatively low so that the PMOS transistor has a low threshold voltage and a high breakdown voltage. If desired, the net N-type doping concentration of N-well 115 may be increased to provide further protection from drain-source punch-through at the expense of a reduced breakdown voltage and an increased threshold voltage. The concentration of N-type dopants in N-well 115 decreases farther down into the epitaxial layer as shown in FIG. 9B. The concentration of N-type dopants increases in N-type up-retro well region 123.

Without up-retro well 123, a PN junction would exist between the N-well body region and the P-epitaxial layer below the N-well. Up-retro well 123 shifts the PN junction deeper into the epitaxial layer to where up-retro well 123 meets P+ buried layer 118 at boundary 127 in FIG. 8C. This provides greater distance between the drain-to-body PN junction and the next PN junction beneath the drain. The greater distance between these PN junctions reduces the likelihood of vertical punch-through between the drain and the P+ buried layer in a thin epitaxial layer at high drain voltages. Up-retro well 123 allows the PMOS transistor with a P-epitaxial layer to be formed with a thin epitaxial layer, to turn on at a low threshold voltage, and to operate properly at high voltages without experiencing vertical punch-through. The doping concentration of N-type dopants in up-retro well 123 may be increased to provide further protection against vertical punch-through at the expense of a reduced breakdown voltage.

Persons skilled in the art further will recognize that the circuitry of the present invention may be implemented using structures and process steps other than those shown and discussed above. All such modifications are within the scope of the present invention, which is limited only by the claims which follow.

What is claimed is:

1. A method for making an integrated circuit with a high voltage NMOS transistor comprising:

implanting and diffusing a first concentration of N-type dopant into a P-type semiconductor substrate to form an N-type buried layer;

implanting a second concentration of P-type dopant into the N-type buried layer;

growing a P-type epitaxial layer over the P-type substrate, wherein P-type dopant of the second concentration diffuse into the epitaxial layer farther than N-type dopant of the first concentration to form a P-type up-retro well in the epitaxial layer; and implanting and diffusing N-type dopant into the epitaxial layer above the up-retro well to form a source region and a drain region for the NMOS transistor.

2. The method defined in claim 1 wherein the net P-type doping concentration in the P-type up-retro well is greater than the net P-type doping concentration at the surface of the P-type epitaxial layer between the source region and drain region.

3. The method defined in claim 1 wherein implanting and diffusing N-type dopant into the epitaxial layer above the up-retro well, to form the source region and the drain region further comprises implanting and diffusing a third concentration of N-type dopant into the epitaxial layer to form source and drain extension regions.

4. The method defined in claim 3 wherein implanting and diffusing N-type dopant into the epitaxial layer above the up-retro well to form the source region and the drain region further comprises implanting and diffusing a fourth concentration of N-type dopant into the epitaxial layer to form a first N+ region within the source extension region and a second N+ region within the drain extension region.

5. The method defined in claim 1 wherein P-type dopant of the second concentration comprises Boron.

6. The method defined in claim 1 wherein the first concentration of N-type dopant comprises Antimony.

7. The method defined in claim 1 wherein the first concentration of N-type dopant comprises Arsenic.

8. The method defined in claim 1 further comprising beating the semiconductor substrate with a rapid thermal anneal after the second concentration of P-type dopant is implanted into the N-type buried layer and before the epitaxial layer is formed.

9. The method defined in claim 1 further comprising toning a gate oxide layer over the epitaxial layer between the drain region and the source region.

10. The method defined in claim 9 further comprising forming a gate over the oxide layer.

11. The method defined in claim 1 further comprising implanting and diffusing N-type dopant into the epitaxial layer to form an N-type sinker that contacts the N-type buried layer.

12. A method for making an integrated circuit with a high voltage NMOS transistor comprising:

implanting and diffusing a first concentration of N-type dopant into a P-type semiconductor substrate to tone an N-type buried layer;

implanting a second concentration of P-type dopant into the N-type buried layer;

growing an N-type epitaxial layer over the P-type substrate, wherein the second concentration of P-type dopant diffuses into the epitaxial layer farther than the first concentration of N-type dopant to form a P-type up-retro well in the epitaxial layer;

implanting and diffusing a third concentration of P-type dopant into the epitaxial layer down to the up-retro well to form a P-type well; and implanting and diffusing N-type dopant into the P-type well above the up-retro well to form a source region and a drain region for the NMOS transistor.

13. The method defined in claim 12 wherein the net P-type doping concentration in the P-type up-retro well is greater than the net P-type doping concentration at the surface of the epitaxial layer in the P-type well between the source region and drain region.

14. The method defined in claim 12 wherein implanting and diffusing N—type dopant into the P—type well above the up-retro well to form the source region and the drain region further comprises implanting and diffusing a fourth concentration of N-type dopant into the epitaxial layer to form source and drain extension regions.

15. The method defined in claim 14 wherein implanting and diffusing N-type dopant into the P-type well above the up-retro well to form the source region and the drain region further comprises implanting and diffusing a fifth concentration of N-type dopant into the epitaxial layer to form a first and second N+ regions within each of the source and drain extension regions, respectively.

16. The method defined in claim 12 wherein P-type dopant of the second concentration comprises Boron.

17. The method defined in claim 12 wherein the first concentration of N-type dopant comprises Antimony.

18. The method defined in claim 12 wherein the first concentration of N-type dopant comprises Arsenic.

19. The method defined in claim 12 further comprising heating the semiconductor substrate with a rapid thermal anneal after the second concentration of P-type dopant is implanted into the N-type buried layer and before the epitaxial layer is formed.

20. The method defined in claim 12 further comprising forming a gate oxide layer over the the epitaxial layer between the drain region and the source region.

21. The method defined in claim 20 further comprising terming a gate over the oxide layer.

22. The method defined in claim 12 further comprising implanting and diffusing N-type dopant into the epitaxial layer to form an N-type sinker that contacts the N-type buried layer.

23. A method for making an integrated circuit with a high voltage PMOS transistor comprising:

implanting and diffusing a first concentration of P-type dopant into an U-type semiconductor substrate to form a P-type buried layer;

implanting a second concentration of N-type dopant into the P-type buried layer;

growing en N-type epitaxial layer over the N-type substrate, wherein N-type dopant of the second concentration diffuses into the epitaxial layer farther than P-type dopant of the first concentration to form an N-type up-retro well in the epitaxial layer; and implanting and diffusing P-type dopant into the epitaxial layer above the up-retro well to form a source region and a drain region for the PMOS transistor.

24. The method defined in claim 23 wherein the net N-type doping concentration in the N-type up-retro well is greater than the net N-type doping concentration at the surface of the N-type epitaxial layer between the source region and drain region.

25. The method defined in claim 23 wherein implanting and diffusing P-type dopant into the epitaxial layer above the up-retro well to form the source region and the drain region further comprises implanting and diffusing a third concentration of P-type dopant into the epitaxial layer to form source and drain extension regions.

26. The method defined in claim 25 wherein implanting anti diffusing P-type dopant into the epitaxial layer above the up-retro well to form the source region and the drain region further comprises implanting and diffusing a fourth concentration of P-type dopant into the epitaxial layer to form a first P+ region within the source extension region and a second P+ region within the drain extension region.

27. The method defined in claim 23 wherein N-type dopant of the second concentration comprises Phosphorous.

28. The method defined in claim 23 wherein the first concentration of P-type dopant comprises Boron.

29. The method defined in claim 23 wherein the first concentration of P-type dopant comprises $BF_2$.

30. The method defined in claim 23 further comprising heating the semiconductor substrate with a rapid thermal anneal after the second concentration of N-type dopant is implanted into the P-type buried layer and before the epitaxial layer is formed.

31. The method defined in claim 23 further comprising forming a gate oxide layer over the epitaxial layer between the drain region and the source region.

32. The method defined in claim 31 further comprising forming a gate over the oxide layer.

33. The method defined in claim 23 further comprising implanting and diffusing P-type dopant into the epitaxial layer to form a P-type sinker that contacts the P-type buried layer.

34. A method for making an integrated circuit with a high voltage PMOS transistor comprising:

implanting and diffusing a first concentration of P-type dopant into an N-type semiconductor substrate to form a P-type buried layer;

implanting a second concentration of N-type dopant into the P-type buried layer;

growing a P-type epitaxial layer over the N-type substrate, wherein the second concentration of N-type dopant diffuses into the epitaxial layer farther than the first concentration of P-type dopant to form an N-type up-retro well in the epitaxial layer;

implanting and diffusing a third concentration of N-type dopant into the epitaxial layer down to the up-retro well to form an N-type well; and implanting and diffusing P-type dopant into the N-type well above the up-retro well to form a source region and a drain region for the PMOS transistor.

35. The method defined in claim 34 wherein the net N-type doping concentration in the N-type up-retro well is greater than the net N-type doping concentration at the surface of the epitaxial layer in the N-type well between the source region and drain region.

36. The method defined in claim 34 wherein implanting and diffusing P-type dopant into the N-type well above the up-retro well to form the source region and the drain region further comprises implanting and diffusing a fourth concentration of P-type dopant into the epitaxial layer to form source and drain extension regions.

37. The method defined in claim 36 wherein implanting and diffusing P-type dopant into the N-type well above the up-retro well to form the source region and the drain region further comprises implanting and diffusing a fifth concentration of P-type dopant into the epitaxial layer to form a first P+ region within the source extension region and a second P+ region within the drain extension region.

38. The method defined in claim 34 wherein the N-type dopant of the second concentration comprises Phosphorous.

39. The method defined in claim 34 wherein the first concentration of P-type dopant comprises Boron.

40. The method defined in claim 34 wherein the first concentration of P-type dopant comprises $BF_2$.

41. The method defined in claim 34 further comprising heating the semiconductor substrate with a rapid thermal anneal after the second concentration of N-type dopant is implanted into the P-type buried layer and before the epitaxial layer is formed.

42. The method defined in claim 34 further comprising forming a gate oxide layer over the epitaxial layer between the drain region and the source region.

43. The method defined in claim 42 further comprising forming a gate over the oxide layer.

44. The method defined in claim 34 further comprising implanting and diffusing P-type dopant into the epitaxial layer to form a P-type sinker that contacts the P-type buried layer.

45. An integrated circuit with a high voltage PMOS transistor comprising:

an N-type semiconductor substrate;

a P-type buried layer in the semiconductor substrate;

an epitaxial layer formed on top of the N-type semiconductor substrate;

an N-type body region in the epitaxial layer;

an N-type up-retro well in the epitaxial layer between the buried layer and the body region;

a P-type source region in the N-type body region; and a P-type drain region in the N-type body region.

46. The integrated circuit defined in claim 45 wherein the net N-type doping concentration in the N-type up-retro well is greater than the net N-type doping concentration at the surface of the epitaxial layer in the N-type body region between the source region and drain region.

47. The integrated circuit defined in claim 45 wherein the epitaxial layer is N-type.

48. The integrated circuit defined in claim 45 wherein:

the epitaxial layer is P-type, and the N-type body region comprises an N-type well region formed in the P-type epitaxial layer, and the P-type source and the P-type drain regions are formed in the N-type well region.

49. The integrated circuit defined in claim 45 wherein the source region comprises a P-type source extension region, and the drain region comprises a P-type drain extension region.

50. The integrated circuit defined in claim 45 the source region comprises a highly doped P-type region and the drain region comprises a highly doped P-type region.

51. The integrated circuit defined in claim 45 wherein the N-type up-retro well is doped with Phosphorous.

52. The integrated circuit defined in claim 45 wherein the P-type buried layer is doped with Boron.

53. The integrated circuit defined in claim 45 wherein the P-type buried layer is doped with $BF_2$.

54. The integrated circuit defined in claim 45 further comprising a gate oxide layer over the epitaxial layer between the drain region and the source region.

55. The integrated circuit defined in claim 54 further comprising a gate over the gate oxide layer.

56. The integrated circuit defined in claim 45 further comprising an P-type sinker in the epitaxial layer that contacts the P-type buried layer.

* * * * *